(12) United States Patent
Hamalainen et al.

(10) Patent No.: US 9,315,894 B2
(45) Date of Patent: Apr. 19, 2016

(54) ATOMIC LAYER DEPOSITION OF METAL PHOSPHATES AND LITHIUM SILICATES

(75) Inventors: Jani Hamalainen, Espoo (FI); Jani Holopainen, Helsinki (FI); Timo Hatanpaa, Espoo (FI); Mikko Ritala, Espoo (FI); Markku Leskela, Espoo (FI)

(73) Assignee: ASM IP HOLDING B.V., Almere (NL)

( * ) Notice: Subject to any disclaimer, the term of this patent is extended or adjusted under 35 U.S.C. 154(b) by 271 days.

(21) Appl. No.: 13/434,520

(22) Filed: Mar. 29, 2012

(65) Prior Publication Data

US 2012/0276305 A1 Nov. 1, 2012

Related U.S. Application Data

(60) Provisional application No. 61/469,530, filed on Mar. 30, 2011.

(51) Int. Cl.
| | |
|---|---|
| *C23C 16/06* | (2006.01) |
| *C23C 16/08* | (2006.01) |
| *C23C 16/18* | (2006.01) |
| *C23C 16/30* | (2006.01) |
| *C23C 16/50* | (2006.01) |

(52) U.S. Cl.
CPC .................. *C23C 16/08* (2013.01); *C23C 16/18* (2013.01); *C23C 16/30* (2013.01); *C23C 16/50* (2013.01)

(58) Field of Classification Search
None
See application file for complete search history.

(56) References Cited

U.S. PATENT DOCUMENTS 6,969,539 B2 11/2005 Gordon et al.

| | | | |
|---|---|---|---|
| 2005/0008772 A1* | 1/2005 | Zhang | C23C 16/30 427/126.1 |
| 2005/0016458 A1* | 1/2005 | Zhang et al. | 118/723 R |
| 2005/0045099 A1* | 3/2005 | Bencher | C23C 16/0245 118/715 |
| 2011/0099798 A1 | 5/2011 | Nilsen et al. | |
| 2012/0295167 A1* | 11/2012 | Holzapfel et al. | 429/319 |

FOREIGN PATENT DOCUMENTS

EP WO2011-045067 * 4/2011

OTHER PUBLICATIONS

Aaltonen et al., "ALD of Thin Films for All-Solid-State Lithium Ion Batteries.". Presented at ALD 2010 Conference, Seoul, South Korea, Jun. 2010.
Aaltonen et al., "Lanthanum titanate and lithium lanthanum titanate thin films grown by atomic layer deposition", J. Mater. Chem., vol. 20, 2010, pp. 2877-2881.
Aaltonen et al., "Reaction Mechanism Studies on ALD of Complex Lithium Compounds.". Presented at Baltic ALD 2010 and GerALD 2 Conference, Hamburg, Germany, Sep. 2010.
Barradas et al., "Simulated annealing analysis of Rutherford backscattering data", Appl. Phys. Lett., vol. 71, Jul. 14, 1997, pp. 291-293.
Cavanagh et al., Atomic Layer Deposition of LiOH and Li2CO3 Using Lithium t-butoxide as the Lithium Source. Presented at ALD 2010 Conference, Seoul, South Korea, Jun. 2010.

(Continued)

*Primary Examiner* — Joseph Miller, Jr.
(74) *Attorney, Agent, or Firm* — Knobbe, Martens, Olson & Bear, LLP

(57) ABSTRACT

The present application relates to atomic layer deposition (ALD) processes for producing metal phosphates such as titanium phosphate, aluminum phosphate and lithium phosphate, as well as to ALD processes for depositing lithium silicates.

18 Claims, 23 Drawing Sheets

(56) References Cited

OTHER PUBLICATIONS

Gandrud et al., "Growth of LiFePO4 cathode material by ALD for 3D-structured all-solid-state lithium ion batteries.". Presented at Baltic ALD 2010 and GerALD 2 Conference, Hamburg, Germany, Sep. 2010.

Hamalainen et al., "ALD of Lithium Containing Compounds", Presented at 11$^{th}$ International Conference on Atomic Layer Deposition, Jun. 29, 2011, Cambridge, Massachusetts, USA.

Knoops et al., "Atomic Layer Deposition for All-Solid-State 3D-Integrated Batteries", ECS Trans., vol. 25, No. 4, 2009, pp. 333-344.

Nieminen et al., "Determination of P/Al Ratio in Phosphorus-Doped Aluminium Oxide Thin Films by XRF, RBS and FTIR", Mikrochim. Acta, vol. 119, 1995, pp. 13-22.

Putkonen et al., "Atomic layer deposition and characterization of biocompatible hydroxyapatite thin films", Thin Solid Films, vol. 527, 2009, pp. 5819-5824.

Putkonen et al., "Atomic layer deposition of lithium containing thin films", J. Mater. Chem., vol. 19, 2009, pp. 8767-8771.

Ritala et al., "Chapter 4: Atomic Layer Deposition", Chemical Vapour Deposition: Precursors, Processes and Applications, The Royal Society of Chemistry, Cambridge, UK, 2009, pp. 158-206.

Sheldrick, G.M., "A short history of SHELX", Acta Cryst.., vol. A64, 2008, pp. 112-122.

Sønsteby et al., "Growth of proton conductor Ca:LaPO4 by ALD for high temperature fuel cell applications.". Presented at Baltic ALD 2010 and GerALD 2 Conference, Hamburg, Germany, Sep. 2010.

Tiitta et al., "Preparation and Characterization of Phosphorus-Doped Aluminum Oxide Thin Films", Mater. Res. Bull., vol. 33, No. 9, 1998, pp. 1315-1323.

Von Mootz et al., "Assoziation im festen Zustand von Bis(trimethysilyl)amidolithium und Methyltrimethylsilanolatoberyllium", Angew. Chem., vol. 81, No. 10, Jahrg. 1969, pp. 398-399.

Wiedmann et al., "Atomic Layer Deposition of Titanium Phosphate and Aluminum Phosphate on Silica Nanoparticles", Presented at 11$^{th}$ International Conference on Atomic Layer Deposition, Jun. 27, 2011, Cambridge, Massachusetts, USA.

Wiedmann et al., "Atomic Layer Deposition of Titanium Phosphate on Silica Nanoparticles", J. Vac. Sci. Technol. A, vol. 30, No. 1, Jan./Feb. 2012, pp. 01A134-1-01A134-8.

Ylilammi et al., "Optical determination of the film thickness in multilayer thin film structures", Thin Solid Films, vol. 232, 1993, pp. 56-62.

Gandrud, Kunt Bjarne, "Thin Film Materials for Li-ion Batteries Made by Atomic Layer Deposition," Doctoral Dissertation, Faculty of Mathematics and Natural Sciences, University of Oslo, Apr. 2014, p. 59.

\* cited by examiner

ATOMIC LAYER DEPOSITION OF METAL PHOSPHATES AND LITHIUM SILICATES

REFERENCE TO RELATED APPLICATIONS

The present application claims priority to U.S. Provisional Application No. 61/469,530, filed Mar. 30, 2011, the disclosure of which is hereby incorporated by reference in its entirety.

BACKGROUND OF THE INVENTION

1. Field of the Invention

The present application relates to atomic layer deposition of metal compounds that find use, for example, in lithium ion battery applications.

2. Description of the Related Art

Atomic layer deposition (ALD) of lithium-containing compounds has recently received attention due in large part to the need for conformal materials in Li ion batteries used in electronic devices. For safety reasons, all-solid-state batteries are of great interest. The power density of all-solid-state batteries can be improved by moving from planar to three-dimensional structures. Fabrication of 3D batteries is challenging because all of the materials, including electrodes, barriers and electrolyte, have to be made conformally. As ALD allows for conformal formation of materials, ALD processes for forming metal-containing compounds used in batteries, such as aluminum, titanium and lithium phosphates, as well as lithium silicates, are desirable.

Metal phosphate thin films, including titanium and aluminum phosphate films can be used in lithium ion batteries, either individually or mixed with other metal phosphates. Mixed metal phosphates can be very demanding to manufacture with precision. While ALD has been a reliable technique to deposit complex materials homogeneously over large areas and on demanding, complex structures, the development of ALD-grown phosphate thin film processes has been quite limited and only a few metal phosphate thin film processes have been reported. The common approach to incorporating phosphorous into films in these ALD processes is to use two sub-cycles, consisting of a metal oxide sub-cycle and a phosphorous oxide sub-cycle, in various ratios.

Titanium and aluminum phosphates have been shown to be applicable in lithium ion batteries either alone or mixed with other phosphates. $TiP_2O_7$ and $LiTi_2(PO_4)_3$ have been examined as anode materials in lithium ion batteries. $AlPO_4$, on the other hand, has been shown to improve the cycle-life performance of lithium ion battery cathodes. Mixed aluminum, titanium and lithium phosphates in various stoichiometries, such as $Li_{1.3}Al_{0.3}Ti_{1.7}(PO_4)_3$, are promising as solid electrolytes for lithium ion batteries because of their high ionic conductivities.

Titanium and aluminum phosphate thin films or mixtures of these with other phosphates may prove to be beneficial also for some other applications. As an example, amorphous phosphates of $TiP_2O_7$ and $Ce_{1-x}Ti_xP_2O_7$ are promising candidates for advanced sunscreen materials in UV-shielding plastics and film applications. The broad-spectrum protection against ultraviolet radiation and chemical stability of these materials exceed those of the conventional sunscreens. $TiP_2O_7$, for example, shows only a low catalytic activity for thermal oxidation and photocatalysis.

Aluminum phosphate, notably $Al(PO_3)_3$, has been studied as a sealant of plasma sprayed lamellar chromium oxide coatings. Additionally, aluminum phosphate thin films with P/Al ratio of 1/2 have been evaluated as gate dielectrics for thin film transistors.

Lithium phosphate, $Li_3PO_4$, is known for its moderate lithium ionic conductivity. As such, $Li_3PO_4$ can be applied as an electrolyte in solid state lithium ion batteries and $CO_2$ gas sensors. Also optical humidity sensors based on $Li_3PO_4$ have been presented recently.

In general, 3D structuring of lithium ion battery materials would be a way to effectively increase the energy storage capacity of the battery applications. As mentioned above, it would be beneficial to have atomic layer deposition (ALD) processes for depositing thin films on such demanding structures, as films grown by ALD inherently possess good conformality and uniformity because of the alternating, saturating precursor doses and self-limiting surface reactions, which lead to accurate thickness controllability and repeatability of the films. Some of the electrolyte material candidates for 3D batteries include for example $Li_3PO_4$ and nitrogen mixed lithium phosphate known as LiPON.

The use of ALD for phosphate thin film deposition has been quite scarce. However, some ALD processes for aluminum phosphate films were developed in the 1990s. Besides aluminum phosphate, ALD processes have been reported for calcium phosphate and titanium phosphate thin films. Also lithium containing ALD processes were absent until recent reports on ALD of lithium hydroxide, lithium carbonate, lithium lanthanate and lithium lanthanum titanates. In addition, ALD of $LiFePO_4$ and $Ca:LaPO_4$ materials have been recently presented.

However, in previous ALD metal phosphate processes, separate metal oxide and phosphorus oxide sub-cycles, both using separate oxygen sources, have been applied to incorporate phosphate into the films. This kind of approach may result in long and complicated growth cycles, which increases the total deposition time required.

Lithium silicates can be applied in lithium ion batteries as solid state electrolytes. Amorphous $Li_2SiO_3$ and $Li_4SiO_4$ films have at room temperature quite limited ionic conductivities of $2.5 \times 10^{-8}$ Scm$^{-1}$ and $4.1 \times 10^{-7}$ Scm$^{-1}$, respectively, for lithium ion battery electrolytes. However, amorphous $Li_2SiO_3$ thin films have shown to have about 1 to 2 orders higher ionic conductivity compared to polycrystalline $Li_2SiO_3$ at elevated temperatures. The ionic conductivity of amorphous $Li_2SiO_3$ can further be increased by optimizing the film thickness. Also the substrate material has been reported to affect the ionic conductivity of amorphous $Li_2SiO_3$.

Lithium silicate can form crystalline compounds with various stoichiometries. The ratios between $Li_2O$ and $SiO_2$ vary in these stoichiometries, thus resulting in $Li_2SiO_3$ (1:1), $Li_2Si_2O_5$ (1:2), $Li_4SiO_4$ (2:1) and $Li_8SiO_6$ (4:1) crystalline structures. Likewise, the properties and thus applicability of the corresponding stoichiometries vary.

$Li_2Si_2O_5$ mixed with carbon black has been suggested as a cathode material for lithium ion batteries. It was found that $Li_2Si_2O_5$ nanowires exhibit much higher capacity compared to 2-D or spherical 3-D nanostructures. Even more, $Li_2Si_2O_5$ nanowires mixed with carbon black have a higher initial Li ion charge capacity compared to the conventional Li—Mn—O or Li—Co—O cathode material systems. Also $SiO_2/Li$ cells have been presented, where the reversible conversion reaction between $SiO_2$ and $Li_2Si_2O_5$ films results in good cycling performance and less than 0.01% per cycle capacity loss during the first 100 cycles. This kind of $SiO_2$—$Li_2Si_2O_5$ conversion system could be an attractive electrode in lithium ion batteries. Likewise, 2 nm of amorphous $Li_2SiO_3$ on top of $LiCoO_2$ electrode has been found to enhance the rate performance of the electrode.

Lithium silicate films consisting of a mixture of $Li_2SiO_3$ and $Li_2Si_2O_5$ on porous silicon may be applied for ozone detection as well due to the increase of ionic conductivity of lithium silicates in presence of ozone. The applicability of lithium silicate electrolytes for $CO_2$ sensors has also been evaluated. It was shown that $Li_2Si_2O_5$ resists 90% relative humidity at elevated temperature far better than the other lithium silicates. In addition, $Li_4SiO_4$ is unstable against $CO_2$ forming $Li_2CO_3$ in ambient conditions while $Li_2SiO_3$ remains stable. $Li_4SiO_4$ membranes have been suggested for $CO_2$ separation at high temperatures. Furthermore, lithium silicates, $Li_4SiO_4$ in particular, are considered as solid tritium breeding materials in fusion power technology.

SUMMARY OF THE INVENTION

In one aspect, metal phosphate thin films are deposited by atomic layer deposition (ALD) using a metal reactant and a phosphate reactant. The metal reactant comprises titanium, aluminum or lithium. In some embodiments the metal reactant is a metal halide, a silyl amide or an alkoxide. The phosphate reactant can have the formula $O=P(OR)_3$, where R can be any alkyl chain or ring, substituted or not. In some embodiments the phosphate reactant does not comprise an —OH group. In some embodiments the phosphate reactant does comprise an O=P bond. In some embodiments the phosphate reactant does comprise an P—O bond. In some embodiments the phosphate reactant does comprise an P—O—C bond structure. In some embodiments an oxygen source that is separate from the metal reactant and phosphate reactant is not used. In some embodiments, the phosphate reactant is trimethyl phosphate (TMPO).

The ALD processes typically comprise a plurality of deposition cycles, each cycle comprising: providing a pulse of a first vapor phase metal reactant into the reaction chamber to form no more than about a single molecular layer of the metal reactant on the substrate; removing excess first reactant from the reaction chamber; providing a pulse of a second vapor phase phosphate reactant to the reaction chamber such that the second vapor phase reactant reacts with the metal reactant on the substrate to form a metal phosphate thin film; and removing excess second reactant and reaction byproducts, if any, from the reaction chamber. In some embodiments the reaction chamber is part of a flow-type reactor.

In some embodiments, the metal reactant may be a metal halide, silyl amide or an alkoxide comprising Al, Ti or Li. For example, the metal reactant may be $AlCl_3$ or $TiCl_4$. In some embodiments the metal reactant is a titanium halide or a titanium metal-organic compound, or mixtures thereof. In other embodiments the metal reactant is an aluminum halide compound or an alkylaluminum compound, such as trimethylaluminum (TMA), triethylaluminum, or mixtures thereof. Mixtures, derivatives and combinations of the metal compounds can also be used, such as dimethylaluminumchloride ($Me_2AlCl$).

In other embodiments, lithium phosphate is deposited using a lithium precursor. Lithium precursors may be, for example, metalorganic lithium compounds. In some embodiments, lithium precursors may be lithium alkoxides, such as lithium tert-butoxide ($LiO^tBu$) or lithium silyl amides, such as a lithium alkylsilylamide like lithium bis(trimethylsilyl) amide, also known as lithium hexamethyldisilazide (LiHMDS; $Li(N(SiMe_3)_2)$). In other embodiments the lithium reactant may be a lithium betadiketonate, for example Li(thd) or Li(hfac). Mixtures, derivatives and combinations of lithium reactants can be used.

The second reactant may be a phosphate reactant. As mentioned above, in some embodiments the phosphate reactant has the formula $O=P(OR)_3$, where R can be any alkyl chain or ring, substituted or not. In some embodiments the phosphate reactant does not comprise an —OH group. In some embodiments the phosphate reactant is TMPO.

In some embodiments the temperature of the process is below about 500° C., below about 400° C., below about 300° C., or below about 200° C. In some embodiments the temperature is above about 100° C., more preferably above about 150° C. In some embodiments the deposition temperature is between about 225° C. and about 350° C.

In another aspect, lithium silicate thin films ($Li_xSi_yO_z$) are deposited by an atomic layer deposition (ALD) process that comprises at least one lithium silicate deposition cycle using a first reactant that comprises both lithium and silicon (a two-metal reactant) and a second reactant that comprises oxygen. In some embodiments no additional reactants are used in at least one of the lithium silicate deposition cycles and thus the two-metal reactant and the oxygen reactant are the only two reactants used. In some embodiments the two-metal reactant and the oxygen reactant are the only reactants used in the ALD process to form the lithium silicate. However, in some embodiments one or more different, additional reactants may be provided in the ALD process. For example, a second deposition cycle may be carried out at intervals in the deposition process to adjust the composition of the film. The second deposition cycle may utilize one or more reactants that are different from the oxygen and the two-metal reactant used in the lithium silicate deposition cycles. Both lithium and silicon from the two-metal reactant are incorporated in the lithium silicate film.

The two-metal reactant comprises both lithium and silicon atoms. In some embodiments, the two-metal reactant is a lithium alkylsilylamide or derivative thereof. For example, the two-metal reactant may be LiHMDS.

The oxygen reactant may be, for example, oxygen, ozone, molecular oxygen, water, or reactive oxygen sources, such as oxygen atoms, plasmas or radicals.

In some embodiments the lithium silicate films have a lithium ionic conductivity at room temperature of greater than about $1 \times 10^{-5}$ S/cm.

Lithium silicates may be, for example, $Li_2SiO_3$, $Li_2Si_2O_5$, $Li_4SiO_4$ or $Li_8SiO_6$. In some embodiments the lithium silicate may be $Li_2SiO_{2.9}$. Other stoichiometries will be apparent to the skilled artisan. In some embodiments, stoichiometry may be adjusted by adjusting the deposition temperature. Deposition temperature may be, for example, from about 150° C. to about 400° C. in some embodiments. In some embodiments the deposition temperature is about 250° C.

The ALD processes for depositing lithium silicate films typically comprise a plurality of deposition cycles, each cycle comprising: providing a pulse of a first vapor phase two-metal reactant into the reaction chamber to form no more than about a single molecular layer of the two-metal reactant on the substrate; removing excess first two-metal reactant from the reaction chamber; providing a pulse of a second vapor phase oxygen reactant to the reaction chamber such that the second vapor phase oxygen reactant reacts with the two-metal reactant on the substrate to form a lithium silicate thin film; and removing excess second reactant and reaction byproducts, if any, from the reaction chamber.

In some embodiments, $Li_2Si_2O_5$ is deposited using an ALD process described herein. This material may be used, for example, as an electrode material. In other embodiments, $Li_2SiO_3$ is deposited by an ALD process described herein. This material may be used, in some embodiments, as an electrode coating material, for example over a $LiCoO_2$ electrode. In other embodiments, $Li_2SiO_3$, $Li_2Si_2O_5$ or a mixture thereof is deposited on porous silicon using ALD methods as described herein. In other embodiments $Li_2SiO_3$ and/or $Li_4SiO_4$ are deposited by ALD methods as described herein and may be used, for example, as solid tritium breeding materials for fusion reactors or for $CO_2$ absorption.

In some embodiments, additional ALD cycles can be included to adjust the composition of the lithium silicate. For example, in some embodiments one or more lithium oxide deposition cycles are included. These additional lithium oxide deposition cycles may increase the amount of lithium in the film. In some embodiments the additional cycles comprise alternately and sequentially contacting the substrate with a lithium precursor, such as lithium tert-butoxide, and on oxygen precursor, such as water.

In some embodiments a different metal is incorporated into the film, such as aluminum, by including a different metal oxide deposition cycle. For example, one or more aluminum oxide deposition cycles may be incorporated to form lithium aluminum silicate. An aluminum oxide deposition cycle may comprise alternately and sequentially contacting the substrate with an aluminum precursor, such as trimethylaluminum (TMA) and an oxygen precursor, such as ozone. The stoichiometry of the $Li_xAl_ySi_zO$ that is deposited can be varied, by varying the ratio of lithium silicate and aluminum oxide deposition cycles. In some embodiments, $LiAlSiO_4$ is deposited

DETAILED DESCRIPTION

Figure 1:
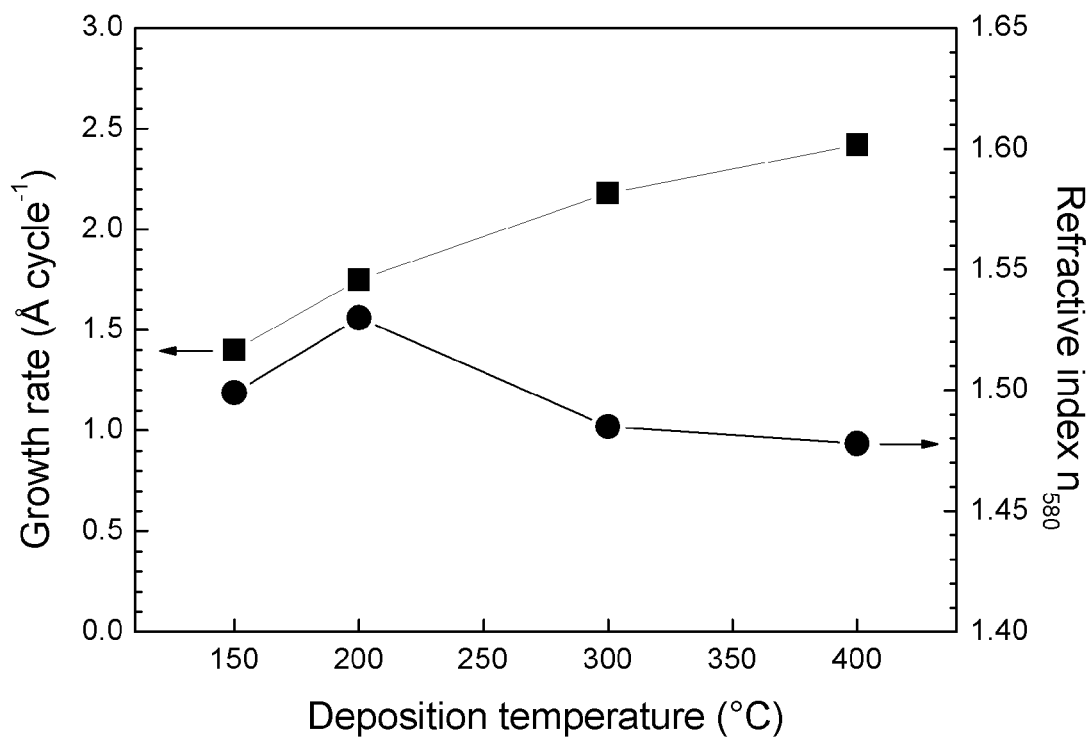
FIG. 1 illustrates growth rates and refractive indices of aluminum phosphate films as a function of deposition temperature. 1000 cycles were applied in each deposition with 2 s precursor pulses and 1 s purges.

As discussed above, metal phosphate films and lithium silicate films find use in a variety of applications, such as in lithium batteries. While some embodiments are discussed in the general context of lithium batteries, the skilled artisan will appreciate that the principles and advantages taught herein will have application to other devices and applications. Furthermore, while a number of processes are disclosed herein, one of ordinary skill in the art will recognize the utility of certain of the disclosed steps in the processes, even in the absence of some of the other disclosed steps, and similarly that subsequent, prior and intervening steps can be added. Each of the references listed is hereby incorporated by reference.

Metal phosphate and lithium silicate thin films can be deposited on a substrate by atomic layer deposition (ALD) type processes. ALD type processes are based on controlled, self-limiting surface reactions of precursor chemicals. Gas phase reactions are avoided by feeding the precursors alternately and sequentially into a reaction chamber comprising one or more substrates on which deposition is desired. Vapor phase reactants are separated from each other in the reaction chamber, for example, by removing excess reactants and/or reactant byproducts from the reaction chamber between reactant pulses.

Briefly, a substrate is loaded into a reaction chamber and is heated to a suitable deposition temperature, generally at lowered pressure. Deposition temperatures are maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved.

A first reactant is conducted or pulsed into the chamber in the form of a vapor phase pulse and contacted with the surface of the substrate. Conditions are preferably selected such that no more than about one monolayer of the first reactant is adsorbed on the substrate surface in a self-limiting manner. The appropriate pulsing times can be readily determined by the skilled artisan based on the particular circumstances. Excess first reactant and reaction byproducts, if any, are removed from the reaction chamber, such as by purging with an inert gas.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

A second gaseous reactant is pulsed into the chamber where it reacts with the first reactant bound to the surface. Excess second reactant and gaseous byproducts of the surface reaction, if any, are removed from the reaction chamber, preferably by purging with the aid of an inert gas and/or evacuation. The steps of pulsing and purging are repeated until a thin film of the desired thickness has been formed on the substrate, with each cycle leaving no more than a molecular monolayer. Additional phases comprising provision of a reactant and purging of the reaction space can be included to form more complicated materials, such as ternary materials.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of the reaction space and/or purging the reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are conducted or "pulsed" into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Pulsing times can be on the order of minutes in some cases. The optimum pulsing time can be determined by the skilled artisan based on the particular circumstances.

Before starting the deposition of the film, the substrate is typically heated to a suitable growth temperature. The growth temperature varies depending on the type of thin film formed, physical properties of the precursors, etc. In some embodiments the growth temperature can be less than the crystallization temperature for the deposited materials such that an amorphous thin film may be formed while in other embodiments it can be above the crystallization temperature such that a crystalline thin film may be formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

In some embodiments the reaction chamber is part of a flow-type reactor. Thus, in some embodiments reactants flow from an inlet, over the substrate and to a separate outlet. Reactants may be provided with the aid of a carrier gas, preferably an inert carrier gas.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. Preferably, reactants are kept separate until reaching the reaction chamber, such that shared lines for the precursors are minimized.

The growth processes can optionally be carried out in a reactor or reaction space connected to a cluster tool. Because each reaction space is dedicated to one type of process in a cluster tool, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

ALD of Metal Phosphates

In some embodiments metal phosphates comprising Li, Ti or Al are formed by atomic layer deposition process comprising a metal phosphate deposition cycle in which a substrate is alternately and sequentially contacted with a metal reactant comprising Li, Ti or Al and a phosphate reactant. In some embodiments an oxygen precursor that is different from the metal reactant and the phosphate reactant is not used in the metal phosphate deposition cycle. Thus, in some embodiments a separate oxygen precursor, distinct from the metal reactant and phosphate reactant, is not provided during at least one, and preferably during each metal phosphate deposition cycle. In some embodiments, $H_2O$, ozone or molecular $O_2$ are not used as an oxygen reactant in the metal phosphate deposition cycle.

In some embodiments the metal reactant and the phosphate reactant are the only reactants that contact the substrate in an ALD deposition cycle for depositing metal phosphate. In other embodiments, the metal reactant and the phosphate reactant are the only reactants used in the ALD process. In some embodiments, none of the reactants used in the ALD process or the metal phosphate deposition cycle comprise an —OH bond. In some embodiments an oxygen-containing reactant different from the metal reactant and the phosphate reactant is not provided between one or more deposition cycles Thus, in some embodiments in a metal phosphate deposition cycle a first metal reactant comprising Li, Ti or Al is conducted or pulsed into the chamber in the form of a vapor phase pulse and contacted with the surface of the substrate. Conditions are preferably selected such that no more than about one monolayer of the first metal reactant is adsorbed on the substrate surface in a self-limiting manner. The appropriate pulsing times can be readily determined by the skilled artisan based on the particular circumstances. In some embodiments, pulsing times are from about 0.05 to 10 seconds.

In some embodiments the metal reactant is a metal halide. In some embodiments the metal reactant is a transition metal halide. In some embodiments the metal reactant is a metal chloride. In some embodiments the metal reactant is a transition metal chloride. In some embodiments, the metal reactant may be a metal halide, silyl amide or an alkoxide comprising Al, Ti or Li. In some embodiments the metal reactant may be a metal halide, alkylamine, silylamine or an alkoxide compound comprising Ti, Zr, Hf, V, Nb, Ta, Mo or W.

In some embodiments the metal reactant is a titanium halide or a titanium metal-organic compound, or mixtures thereof. For example, the metal reactant may be $TiCl_4$.

In some embodiments the metal reactant is an aluminum halide compound, such as $AlCl_3$, or an alkylaluminum compound, such as trimethylaluminum (TMA), triethylaluminum, or mixtures thereof. Mixtures, derivatives and combinations of the metal compounds can also be used, such as dimethylaluminumchloride ($Me_2AlCl$).

In some embodiments, lithium phosphate is deposited using a lithium precursor. Lithium precursors may be, for example, metalorganic lithium compounds. In some embodiments, lithium precursors may be lithium alkoxides, such as lithium tert-butoxide ($LiO^tBu$) or lithium silyl amides, such as a lithium alkylsilylamide like lithium bis(trimethylsilyl) amide, also known as lithium hexamethyldisilazide (LiHMDS; $Li(N(SiMe_3)_2)$). In other embodiments the lithium reactant may be a lithium betadiketonate, for example Li(thd) or Li(hfac). Mixtures, derivatives and combinations of lithium reactants can be used.

In some embodiments, the phosphate reactant has the formula $O=P(OR)_3$, where R can be any alkyl chain or ring, substituted or not. In some embodiments the phosphate reactant is one that comprises a P—O single bond or a P=O double bond. In some embodiments the phosphate reactant may be, for example, trimethyl phosphate (TMPO). In some embodiments, the phosphate reactant does not comprise an —OH group.

In some embodiments, titanium phosphate is deposited using a titanium halide reactant, such as $TiCl_4$.

In some embodiments, aluminum phosphate is deposited using an aluminum halide, such as $AlCl_3$. In some embodiments, aluminum phosphate is deposited by alternately and sequentially contacting the substrate with an aluminum halide, such as $AlCl_3$ and a phosphate reactant, such as TMPO, where no water or other additional oxygen-containing reactant is used.

In some embodiments, lithium phosphate is deposited using a lithium silyl amide, such as lithium hexamethyldisilazide $Li(N(SiMe_3)_2)$, also known as lithium bis(trimethylsilyl)amide). In other embodiments, a lithium tert-butoxide ($LiO^tBu$) is used as the metal reactant to deposit lithium phosphate.

After the first metal reactant has been provided and allowed to contact the substrate, excess first reactant and reaction byproducts, if any, are removed from the reaction chamber, such as by purging with an inert gas. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

A second gaseous reactant comprising phosphate is pulsed into the chamber where it reacts with the first metal reactant bound to the surface Excess second reactant and gaseous byproducts of the surface reaction, if any, are removed from the reaction chamber, preferably by purging with the aid of an inert gas and/or evacuation. The metal phosphate deposition cycle, comprising the steps of pulsing and purging the first metal precursor and the second phosphate precursor, is repeated until a thin metal phosphate film of a desired thickness has been formed on the substrate. For example, a metal phosphate deposition cycle may comprise alternately and sequentially pulsing and purging the first metal precursor comprising Li, Ti or Al and the second phosphate precursor until a film of lithium phosphate, titanium phosphate or aluminum phosphate of the desired thickness has been formed on the substrate. As mentioned above, in some embodiments each deposition cycle leaves no more than a molecular monolayer of metal phosphate.

Although referred to as the first and second reactants, the deposition cycle may begin with provision of either the metal reactant or the phosphate reactant. However, if the phosphate reactant is provided first, film growth may not be achieved until subsequent deposition cycles.

In some embodiments, additional phases comprising provision of one or more different reactants and purging of the reaction space can be included to form more complicated materials, such as ternary materials, for example $Li_xTi_y(PO_4)_z$ or $Li_xTi_yAl)(PO_4)_a$. The additional reactant or reactants can be provided as part of one or more of the metal phosphate deposition cycles. For example, in a single deposition cycle a substrate may be contacted with a first metal reactant, a second metal reactant comprising a different metal from the first metal reactant, and a phosphate reactant.

In some embodiments one or more additional reactants is provided between two metal phosphate deposition cycles. In some embodiments, a second atomic layer deposition cycle is provided at desired intervals during the ALD process to achieve a thin film with a desired composition. For example, a first metal phosphate deposition cycle, comprising alternately and sequentially contacting a substrate with a first metal reactant and a phosphate reactant, may be provided at a desired ratio with a second metal phosphate deposition cycle comprising contacting the substrate with a second, different metal precursor and a second phosphate precursor. In some embodiments the second phosphate precursor may be the same as the first phosphate precursor.

In some specific embodiments, $AlCl_3$ and TMPO are used as the metal reactant and the phosphate reactant to deposit aluminum phosphate by ALD. In some embodiments $TiCl_4$ and TMPO are used to deposit titanium phosphate by ALD. In some embodiments, LiHMDS and TMPO are used to deposit lithium phosphate by ALD. In some embodiments, LiO$^t$Bu and TMPO are used to deposit lithium phosphate by ALD.

As mentioned above, in some embodiments metal phosphate, such as aluminum, titanium and/or lithium phosphate, is grown without the use of an additional oxygen source, such as $H_2O$, molecular $O_2$ or ozone.

Each pulse of each ALD cycle is preferably self-limiting. An excess of reactant precursors is supplied to saturate the susceptible structure surfaces. Surface saturation ensures reactant occupation of all available reactive sites (subject, for example, to physical size or "steric hindrance" restraints) and thus ensures excellent step coverage.

Removing excess reactants can include evacuating some of the contents of the reaction space and/or purging the reaction space with helium, nitrogen or another inert gas. In some embodiments purging can comprise turning off the flow of the reactive gas while continuing to flow an inert carrier gas to the reaction space.

Although the reactants may be referred to as the first reactant and the second reactant in the description, the skilled artisan will recognize that in some situations the "second" reactant may be provided first.

In some embodiments, the reactants and reaction by-products can be removed from the reaction chamber by stopping the flow of the metal or phosphate while continuing the flow of an inert carrier gas such as nitrogen or argon.

The deposition temperature is preferably below about 500° C. and above about 100° C., although in some embodiments other temperatures may be used. In some embodiment, the metal phosphates are deposited at a reaction temperature of between about 225° C. and about 350° C.

ALD of Lithium Silicates

In some embodiments lithium silicates are formed by ALD using a lithium silicate deposition cycle in which a substrate is alternately and sequentially contacted with a metal reactant comprising lithium and silicon (a two-metal precursor) and an oxygen precursor. In some embodiments the two-metal reactant and the oxygen reactant are the only reactants that contact the substrate in each lithium silicate deposition cycle. Both lithium and silicon from the two-metal reactant are incorporated in the lithium silicate film.

The lithium silicates can have the formula $Li_xSi_yO_z$. The x, y and z values and thus the composition of the lithium silicate film can vary. In some embodiments, x, y and z may be less than 1. In other embodiments one or more of the values may be an integer. Lithium silicates may be, for example, $Li_2SiO_3$, $Li_2Si_2O_5$, $Si_4SiO_4$ or $Li_8SiO_6$. Other stoichiometries will be apparent to the skilled artisan.

In some embodiments, one or more ALD deposition cycles that are distinct from the lithium silicate deposition cycles are provided in the ALD process. In the distinct cycles, at least one of the reactants is different from those used in the lithium silicate deposition cycles. In some embodiments the metal-containing reactant is different. In some embodiments the oxygen reactant is the same, while in some embodiments it may be different.

In some embodiments, one or more distinct ALD cycles for providing additional lithium may be provided, thus enriching the lithium silicate with lithium. For example, one or more lithium oxide deposition cycles may be carried out during the deposition process. The lithium reactant may be different from the two-metal precursor used in the lithium silicate deposition cycles.

In some embodiments, the lithium silicate deposition process can be adjusted to obtain the desired Li:Si ratio in the thin film by adding one or more $SiO_2$ deposition cycles to the process.

In other embodiments one or more different metal oxides may be deposited in separate deposition cycles to provide a more complex silicate. For example, one or more aluminum oxide deposition cycles may be provided to form a lithium aluminum silicate. As another example, one or more vanadium oxide deposition cycles may be provided to form a lithium vanadium silicate.

The additional ALD cycles can be provided at a selected ratio with the lithium silicate deposition cycles to obtain a film with the desired composition and properties.

In some embodiments, the lithium content of the lithium silicate can be increased by including one or more lithium oxide ALD cycles in the deposition process. In the lithium oxide deposition cycle, the substrate is alternately and sequentially contacted with a lithium precursor and an oxygen precursor. For example, the substrate may be alternately and sequentially contacted with lithium tert-butoxide and an oxygen precursor, such as water. The oxygen precursor may be the same or different from the oxygen precursor used in the lithium silicate deposition cycles. The ratio of the lithium silicate deposition cycles to the lithium oxide deposition cycles can be adjusted to obtain the desired amount of lithium in the thin film. For example, in some embodiments $Li_4SiO_4$ is deposited.

In some embodiments one or more additional metals is incorporated into the film by providing one or more metal oxide deposition cycles. For example, a lithium aluminum silicate can be formed by providing one or more aluminum oxide ALD deposition cycles during the deposition process. In some embodiments the metal oxide deposition cycle comprises alternately and sequentially contacting the substrate with a metal precursor and an oxygen precursor. Again, the oxygen precursor may be the same or different from the oxygen precursor used in the lithium silicate deposition cycles. For example, the substrate may be contacted with an aluminum precursor, such as TMA, and an oxygen precursor, such as ozone or water. The metal oxide deposition cycle is provided at a selected ratio to obtain a lithium metal silicate with a desired composition and properties. In some embodiments, an aluminum oxide deposition cycle is provided at intervals during the lithium silicate deposition process to obtain a lithium aluminum silicate, such as $LiAlSiO_4$.

In some embodiments the deposition temperature is about 150° C. to about 400° C. In some embodiments, the composition of the lithium silicate film can be varied by adjusting the deposition temperature. In some embodiments, lithium silicate is deposited at a temperature of about 250° C. The lithium silicate may have the formula $Li_2SiO_{2.9}$.

In some embodiments the lithium silicate films have a lithium ionic conductivity at room temperature of greater than about $1 \times 10^{-5}$ S/cm.

The two-metal reactant comprises both lithium and silicon atoms. In some embodiments, the two-metal reactant is a lithium silyl amide, such as a lithium alkylsilylamide, or derivative thereof. In some embodiments, lithium silicate is deposited using lithium hexamethyldisilazide (LiHMDS; $Li(N(SiMe_3)_2)$, also known as lithium bis(trimethylsilyl)amide).

The oxygen reactant may be, for example, oxygen, ozone, molecular oxygen, water, or reactive oxygen sources, such as oxygen atoms, plasmas or radicals.

The oxygen reactant may be provided as an oxygen-containing gas pulse and can be a mixture of oxygen and inactive gas, such as nitrogen or argon.

In some embodiments the oxygen reactant may be a molecular oxygen-containing gas pulse. In some embodiments the oxygen reactant comprises an activated or excited oxygen species. In some embodiments the oxygen reactant is atomic oxygen or oxygen radicals.

In some embodiments the oxygen reactant comprises ozone. The oxygen source may be pure ozone or a mixture of ozone and another gas, for example an inactive gas such as nitrogen or argon. In other embodiments the oxygen reactant is oxygen plasma.

The oxygen reactant may be provided, for example, by pulsing ozone or a mixture of ozone and another gas into the reaction chamber. In other embodiments, ozone is formed inside the reactor, for example by conducting oxygen containing gas through an arc. In other embodiments an oxygen containing plasma is formed in the reactor. In some embodiments the plasma may be formed in situ on top of the substrate or in close proximity to the substrate. In other embodiments the plasma is formed upstream of the reaction chamber in a remote plasma generator and plasma products are directed to the reaction chamber to contact the substrate. As will be appreciated by the skilled artisan, in the case of remote plasma the pathway to the substrate can be optimized to maximize electrically neutral species and minimize ion survival before reaching the substrate.

Thus, in some embodiments in a lithium silicate deposition cycle a first two-metal reactant comprising Li and Si is conducted or pulsed into the chamber in the form of a vapor phase pulse and contacted with the surface of the substrate. Conditions are preferably selected such that no more than about one monolayer of the first two-metal reactant is adsorbed on the substrate surface in a self-limiting manner. The appropriate pulsing times can be readily determined by the skilled artisan based on the particular circumstances. In some embodiments, pulsing times are from about 0.05 to 10 seconds.

Excess first reactant and reaction byproducts, if any, are removed from the reaction chamber, such as by purging with an inert gas. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

A second gaseous reactant comprising oxygen is pulsed into the chamber where it reacts with the first two-metal reactant bound to the surface. In some embodiments, the oxygen reactant is selected from $H_2O$, ozone ($O_3$), molecular oxygen ($O_2$) and reactive oxygen sources, such as oxygen atoms, plasmas and radicals. Other oxygen reactants may be used.

Excess second oxygen reactant and gaseous byproducts of the surface reaction, if any, are removed from the reaction chamber, preferably by purging with the aid of an inert gas and/or evacuation.

The lithium silicate deposition cycle, comprising the steps of pulsing and purging the first two-metal precursor, comprising Li and Si, and the second oxygen precursor is repeated until a thin film of lithium silicate of the desired thickness has been formed on the substrate, with each cycle leaving no more than a molecular monolayer.

Additional phases comprising provision of a reactant and purging of the reaction space can be included to form more complicated materials, such as ternary materials.

In some specific embodiments, LiHMDS and ozone are used as the two-metal reactant and the oxygen reactant to deposit lithium silicate by ALD Each pulse of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage.

Removing excess reactants can include evacuating some of the contents of the reaction space and/or purging the reaction space with helium, nitrogen or another inert gas. In some embodiments purging can comprise turning off the flow of the reactive gas while continuing to flow an inert carrier gas to the reaction space.

Although the reactants may be referred to as the first reactant and the second reactant in the description, the skilled artisan will recognize that in some situations the "second" reactant may be provided first.

In some embodiments, the reactants and reaction by-products can be removed from the reaction chamber by stopping the flow of the metal or phosphate while continuing the flow of an inert carrier gas such as nitrogen or argon.

The stoichiometry of the lithium silicate can be controlled by adjusting the reaction conditions. For example, the lithium silicate may be $Li_2SiO_3$, $Li_2Si_2O_5$, $Li_4SiO_4$ or $Li_8SiO_6$. As mentioned above, one way to achieve increased lithium content is to add lithium oxide deposition sub-cycles to the ALD process. Also as mentioned above, one way to achieve increased silicon content is to add silicon oxide deposition sub-cycles to the ALD process.

As mentioned above, lithium silicates can be used in a variety of contexts. In some embodiments the lithium silicate is used in a lithium ion battery. The lithium silicate may serve as a solid state electrolyte. In some embodiments lithium silicate nanowires are formed and used as a cathode material. In some embodiments the lithium silicate is formed over a three-dimensional structure.

Other applications are also possible. For example, in some embodiments the lithium silicate may be used as a solid tritium breeding material for a fusion reactor. In some embodiments the lithium silicate layer is used for $CO_2$ absorption.

The following non-limiting examples illustrate certain embodiments.

EXAMPLES

ALD of Titanium and Aluminum Phosphates

The atomic layer deposition (ALD) of phosphate containing thin films using reactions between metal halide and phosphorus source without any additional oxygen sources was examined. Two very common metal halides, $AlCl_3$ and $TiCl_4$, were used in conjunction with trimethyl phosphate (TMPO) to grow corresponding metal phosphate films. Aluminum phosphate thin films were deposited at temperatures between 150 and 400° C. while titanium phosphate films grew between 275 and 450° C. Amorphous films of $Al_{2.6}PO_{7.0}$ and $Al_{1.6}PO_{5.6}$ were deposited at 200 and 300° C., respectively, while the amorphous titanium phosphate films deposited at 300 and 400° C. consisted of $Ti_{0.8}PO_{3.9}$ and $Ti_{0.6}PO_{3.5}$ ($Ti_{1.2}P_2O_7$). The films were analyzed using high temperature XRD to study the crystallization and stability of the deposited films. Also the surface morphology of the annealed films was examined by FESEM.

Thin films were grown in a cross-flow F-120 ALD reactor (ASM Microchemistry Ltd., Finland) under a nitrogen pressure of about 5-10 mbar. Nitrogen was produced with a domnick hunter G2100E nitrogen generator and used as a carrier and a purging gas. Silicon (111) and soda lime glass (5×5 cm$^2$) were used as substrates. $AlCl_3$ (98%, Riedel-de Haën) and trimethyl phosphate, TMPO (97%, Merck), were sublimed at 90° C. and RT, respectively, inside the reactor and pulsed into the reaction chamber using inert gas valving. $TiCl_4$ (>99.0%, Fluka) was pulsed into the reactor through solenoid valves from an external source held at RT.

Film thicknesses and refractive indices at a wavelength of 580 nm were evaluated from reflectance spectra measured between 370 and 1100 nm by a Hitachi U-2000 spectrophotometer. Some of the film thicknesses were also determined from X-ray reflectivity (XRR) patterns measured with a Bruker AXS D8 Advance diffractometer. Film crystallinity and phase structure were determined with a PANalytical X'Pert Pro MPD diffractometer using $CuK_\alpha$-radiation. High temperature X-ray diffraction (HTXRD) measurements were conducted in an Anton-Paar HTK1200N oven in oxygen (99.9999%) and nitrogen (99.999%, further purified with Entegris 35KF-I-4R inert gas purifier) atmospheres. Temperature was raised in 50° C. steps with a rate of 15° C./min and two minutes waiting period preceded each 30 min measurement. The measurements were conducted in grazing incidence mode (GIXRD)) using a multilayer mirror. The angle of incidence was always 1°. In addition, some of the films were annealed under $N_2$ (99.999%) in a furnace. Surface morphology of the films was examined using a Hitachi S-4800 field emission scanning electron microscope (FESEM) after coating the samples with about 1 nm thick Pt/Pd coating.

Elemental compositions of the films were determined with elastic recoil detection analysis (ERDA) using a 35 MeV $Cl^{7+}$ ion beam. The recoil ions were detected with a Bragg Ionization Chamber using a full energy detection circuit and a fast timing circuit to obtain a Z dependent signal to separate ion species. Hydrogen was detected with a separate solid state detector preceded by an Al foil to stop other scattered and recoiled ions. The resulting ERDA spectra and the RBS spectrum from Cl backscattering were fitted simultaneously using the program NDF (Barradas, N. P.; Jeynes, C.; Webb, R. P. Appl. Phys. Lett. 1997, 71, 291).

Adhesion of the films to the substrates was examined using a common Scotch tape test. High electric resistivity of the films was verified with a four-point probe technique.

Aluminum phosphate depositions were carried out using $AlCl_3$ and TMPO as precursors. FIG. 1 presents the growth rates and refractive indices of the deposited films as a function of deposition temperature. The growth rate increases steadily from 1.4 Å/cycle to 2.4 Å/cycle when the deposition temperature is increased from 150 to 400° C. The film grown at 100° C. was not homogeneous while the film deposited at 150° C. reacted in air shortly after the deposition, which may explain the lower refractive index compared to the film deposited at 200° C. The refractive index is the highest at 200° C. (1.53) and decreases with increasing deposition temperature to 1.48 (400° C.). All the deposited aluminum phosphate films were X-ray amorphous. The films were highly resistive as sheet resistances of the films could not be determined with the four-point probe measurements. In addition, the films passed the common tape test indicating good adhesion to the substrate.

Figure 2:
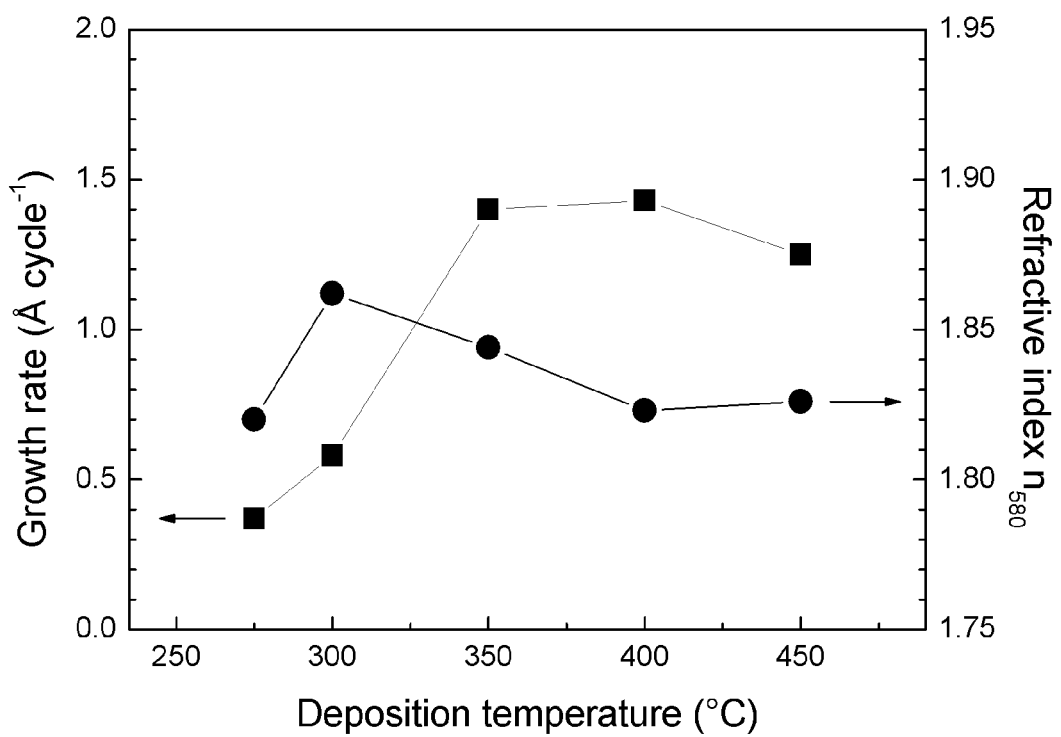
FIG. 2 illustrates growth rates and refractive indices of titanium phosphate films as a function of deposition temperature. 1000 cycles were applied in each deposition with 1 s precursor pulses and purges.

Titanium phosphate films were deposited using $TiCl_4$ and TMPO as precursors. The growth rates and refractive indices of the films are presented in FIG. 2. The growth rate is 0.4 Å/cycle to 0.6 Å/cycle at 275-300° C. and increases to about 1.4 Å/cycle at 350° C. The refractive index behaves quite similarly as in the case of aluminum phosphate as the refractive index of the titanium phosphate films increases rapidly from the lowest deposition temperature (1.82 at 275° C.) to 1.86 at 300° C. and starts then to decrease with increasing deposition temperature back to 1.82. The lower growth rate and a bit higher refractive index at 450° C. may be related to a slight decomposition of TMPO. The film grown at 500° C. was not homogeneous most likely due to partial TMPO decomposition, while no film growth was observed at 250° C. All the titanium phosphate films deposited successfully at various temperatures proved to be X-ray amorphous. Similar to the aluminum phosphate films also titanium phosphate films were highly resistive and did not show conductivity in the four-point probe measurements. Likewise, the films survived the common tape test.

Figure 3A:
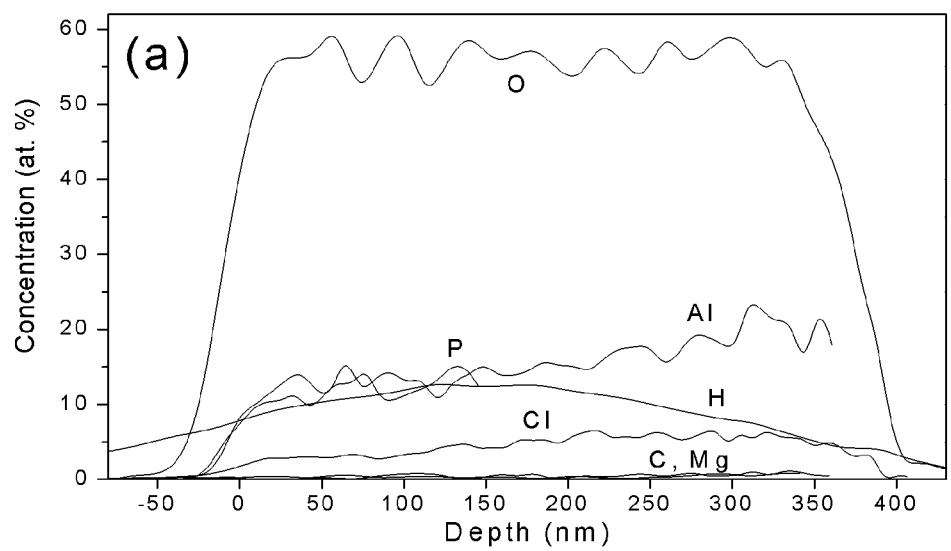
FIG. 3 shows ERDA depth profiles of aluminum (FIG. 3A) and titanium (FIG. 3B) phosphate thin films deposited at 300 and 400° C., respectively. The depth unit, nm, displayed in the figures was converted from at/cm² obtained directly from the measurements and from an estimated density. The depths in the graphs do not correspond to the measured thicknesses. The depth resolution for H (about 100 nm) is worse than for the other elements because another detection system had to be used.
Figure 3B:
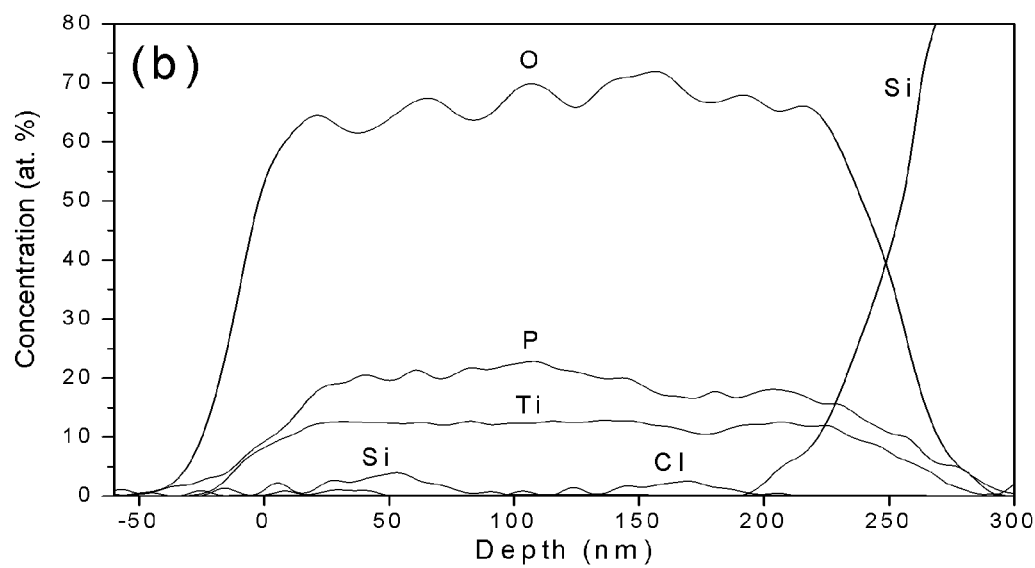

Elemental compositions of the aluminum and titanium phosphate films were measured with ERDA. The resulting depth profiles of the aluminum and titanium phosphate thin films deposited at 300 and 400° C., respectively, are shown in FIG. 3. In the case of aluminum phosphate (FIG. 3a), the profiles for aluminum and phosphorus are based on the recoil spectra. The recoil spectra for phosphorus could not be separated from chlorine scattering long enough to see the end of the film layer; hence the depth profile for phosphorus is abruptly cut in FIG. 3a. In addition, the relative aluminum content slightly increases near the substrate interface (FIG. 3a). Similar kind of increase was observed in the ERDA depth profile of the aluminum phosphate film deposited at 200° C. On the other hand, the depth profiles for titanium phosphate (FIG. 3b) showed uniform composition through the film at 400° C. Similar behavior was observed also at lower deposition temperature (300° C.).

The elemental compositions of the analyzed films are presented in Table 1. Aluminum phosphate has two simple crystalline stoichiometries, $AlPO_4$ and the phosphorus rich $Al(PO_3)_3$. $Al(PO_3)_3$ has a cubic structure while $AlPO_4$ can form cubic, orthorhombic and hexagonal crystal structures. In the crystalline $AlPO_4$, the aluminum to phosphorus ratio is 1, which is far smaller than obtained in this study. However, the increase in deposition temperature from 200 to 300° C. leads to a decrease in aluminum to phosphorus ratio from 2.6 to 1.6, respectively. This indicates that higher deposition temperatures assist the incorporation of phosphorus into films. Overall, the Al/P ratio exceeding 1 suggests that the films consist of a mixture of $Al_2O_3$ and $AlPO_4$.

TABLE 1

Elemental compositions of the aluminum and titanium phosphate thin films as measured with ERDA.

| dep. temp. (° C.) | M (at %) | P (at %) | O (at %) | C (at %) | H (at %) | Cl (at %) | M:P:O ratio |
|---|---|---|---|---|---|---|---|
| $Al_xP_yO_z$ (M = Al) | | | | | | | |
| 200 | 19.9 | 7.74 | 53.8 | <0.2 | 8.93 | 9.22 | 2.6:1:7.0 |
| 300 | 15.8 | 9.97 | 56.3 | 0.37 | 12.1 | 4.75 | 1.6:1:5.6 |
| $Ti_xP_yO_z$ (M = Ti) | | | | | | | |
| 300 | 13.2 | 16.9 | 65.1 | 0.98 | 2.99 | 0.71 | 0.8:1:3.9 |
| 400 | 12.2 | 19.4 | 68.1 | <0.2 | 0.31 | <1 | 0.6:1:3.5 |

The results are based on a sample model that was fitted to the measured spectra.

The results from the ERDA measurements would translate to the aluminum phosphate stoichiometries of roughly $Al_{2.6}PO_{7.0}$ and $Al_{1.6}PO_{5.6}$ at 200 and 300° C., respectively.

Although the carbon content is low in the analyzed aluminum phosphate films, substantial amount of chlorine and hydrogen impurities were found. However, the chlorine content decreases from about 9 at % to 5 at % between 200 and 300° C. In the study by Tiitta et al. the phosphorus content was found to decrease when $P_2O_5$ was delivered after the $AlCl_3$ pulse instead of the $H_2O$ pulse. This was explained by that $P_2O_5$ prefers to react with —OH surface rather than with a —Cl terminated surface, or that the reaction with the —Cl terminated surface leads to the formation of volatile phosphorus and chlorine-containing compounds under the conditions used. Although the phosphorus source in our study is different (TMPO), it may still be possible that the surface reactions between $AlCl_3$ and TWO are incomplete or slow, thus leading into large chlorine content in the films.

Surprisingly the hydrogen content in the aluminum phosphate films behaves quite opposite to the chlorine content; with increasing deposition temperature the hydrogen content increases from 9 at % to 12 at % (Table 1). The films contained also small amounts of magnesium (0.4-0.5 at %), the origin of which is not known. The film deposited at 300° C. has also 0.3 at % silicon, which most probably is an artifact originating from the overlapping signals for Cl scattering and Si recoils.

The titanium phosphate films analyzed by ERDA showed considerably lower impurity levels compared to the aluminum phosphate films (Table 1). In fact, the film deposited at 400° C. contains only <0.2 at % carbon and 0.3 at % hydrogen. Furthermore, the amount of chlorine was too small to be measured with ERDA, even though the film was deposited using $TiCl_4$ as the titanium precursor. Also at the lower deposition temperature (300° C.), the chlorine content was still very low (0.7 at %). The levels for carbon and hydrogen impurities were higher, about 1 at % and 3 at %, respectively. The phosphorus to titanium ratios were 1.28 and 1.59 at 300 and 400° C., respectively. This again would suggest that higher amount of phosphorus is incorporated in the films at higher deposition temperatures as in the case of aluminum phosphate. The simple crystalline forms of titanium phosphates found from the literature are $TiPO_4$ and $TiP_2O_7$, while the ALD grown films had stoichiometries of $Ti_{0.8}PO_{3.9}$ and $Ti_{0.6}PO_{3.5}$ ($Ti_{1.2}P_2O_7$) at 300 and 400° C., respectively. Therefore, the amorphous films deposited by ALD are relatively close to either $TiPO_4$ or $TiP_2O_7$ stoichiometries depending on the deposition temperature.

Figure 4A:
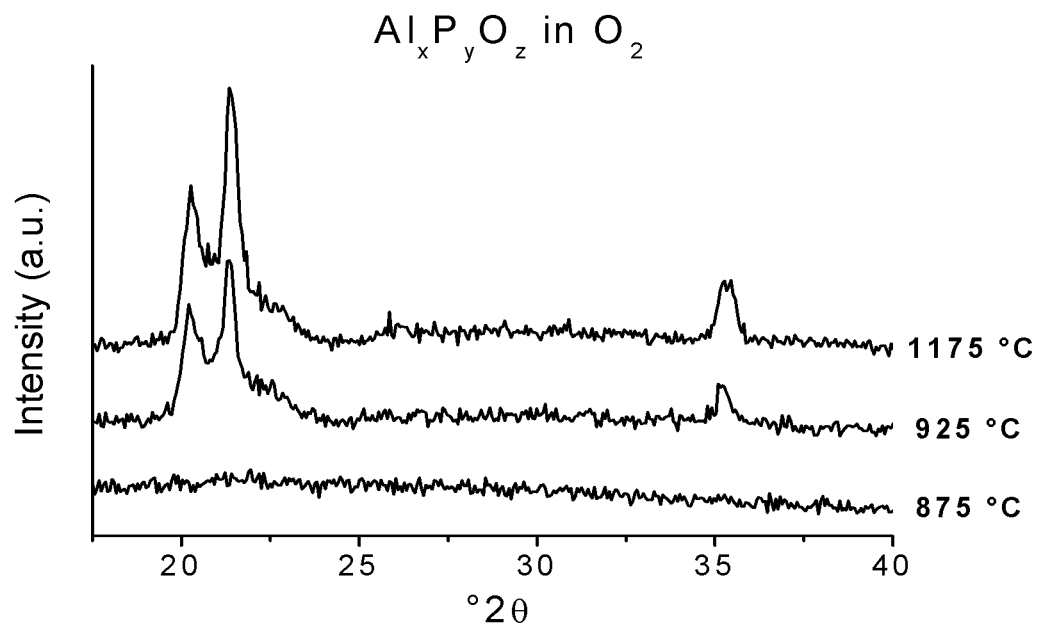
FIG. 4 shows GIXRD patterns of aluminum phosphate films from HTXRD heat treatments under $O_2$ (FIG. 4A) and $N_2$ (FIG. 4B) atmospheres.
Figure 4B:
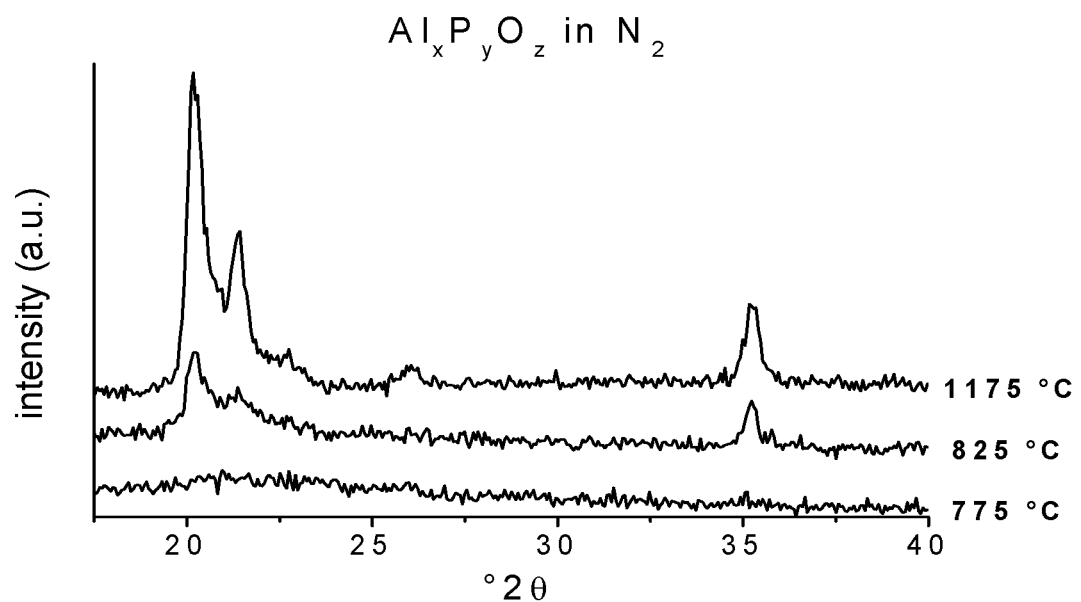

Film crystallization under elevated temperatures was examined by in situ HTXRD measurements under oxygen and nitrogen atmospheres. The films analyzed by ERDA, specifically the aluminum and titanium phosphate films grown at 300° C. and 400° C., respectively, were chosen for these measurements. FIG. 4 shows selected diffractograms obtained during the HTXRD measurements of the ALD aluminum phosphate film. The film remains quite amorphous up to 875° C. in $O_2$ and 775° C. in $N_2$ atmosphere. Crystallization occurs during the next 50° C. heating interval. The same reflections appear in $O_2$ and $N_2$ atmospheres but in different intensity ratios. Two distinct reflections at 21.5° 2θ and 35.5° 2θ are in a close match to cubic $AlPO_4$, however orthorhombic $AlPO_4$ cannot be ruled out either. The intense reflection at 20.5° 2θ and small reflection at 26.1° 2θ might originate from hexagonal berlinite phase, but also several other hexagonal, monoclinic and orthorhombic phases have close reflections in that 2θ range. The wide bump around 21.5° 2θ is more difficult to interpret. However, since binary oxides of phosphorus and aluminum do not make a proper fit with the observed peaks, the crystallized films are concluded to consist of a mixture of aluminum phosphate phases with different relative amounts. The temperatures between 800 and 900° C. are known to be required for crystallization of ALD grown $Al_2O_3$, but also higher temperatures (1050° C.) may be needed. Overall, the peaks observed in HTXRD suggest that the films consist of small crystallites.

Figure 5A:
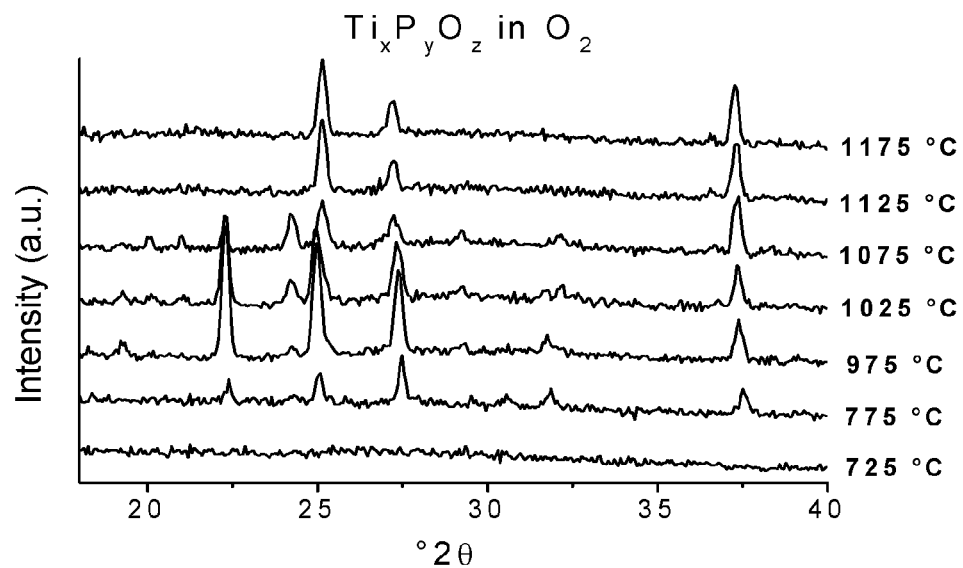
FIG. 5 shows GIXRD patterns of titanium phosphate film from HTXRD heat treatments under $O_2$ (FIG. 5A) and $N_2$ (FIG. 5B) atmospheres.
Figure 5B:
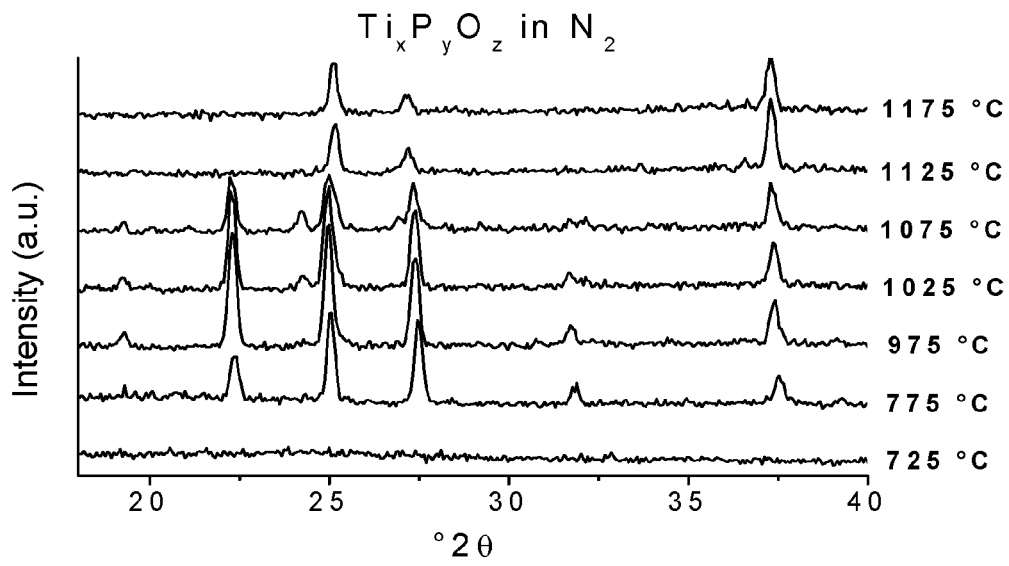

In the HTXRD measurements on the titanium phosphate thin film under $O_2$ and $N_2$, two interesting temperature regions were found (FIG. 5). First, crystallization of the film takes place between 725-775° C. and the resulting phase is cubic $TiP_2O_7$, well in line with the composition measured with ERDA. When heating further, new peaks appear at 24.4° 2θ and 26.9° 2θ that could be from another titanium phosphate polymorph, $Ti_4P_6O_{23}$. Finally above 1075° C. the reflections from titanium phosphate phase disappear and new reflections are observed. These fit very well to anatase and rutile phases of $TiO_2$ indicating that the $TiP_2O_7$ decomposes via $Ti_4P_6O_{23}$ to titanium dioxide. The presence of anatase is interesting since $TiO_2$ normally transforms to rutile at much lower temperatures and thus there must be something that strongly stabilizes the anatase phase. As the film was a phosphate at lower temperatures the stabilizing agent might be a phosphorus related residue.

Figure 6:
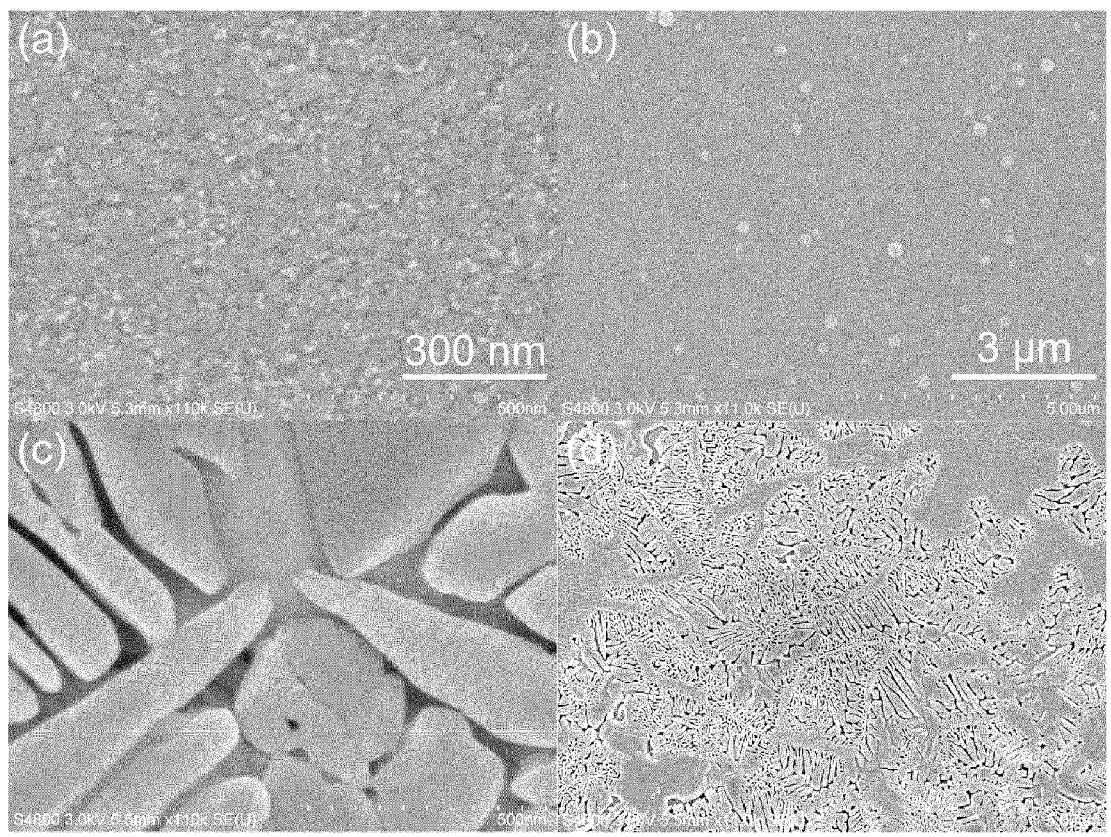
FIG. 6 provides FESEM images of annealed aluminum phosphate (FIG. 6A),(FIG. 6B) and titanium phosphate (FIG. 6C),(FIG. 6D) thin films under $N_2$ flow for two hours at 1000° C. and 900° C., respectively. The images in FIGS. 6A and C have the same magnification level, as do the images in FIGS. 6B and D.

To study the surface morphology of the annealed films, the ALD grown aluminum and titanium phosphate films were heat treated in a furnace at 1000° C. and 900° C., respectively, under $N_2$ flow for two hours. The annealed films were examined by FESEM after coating with about 1 nm thick Pt/Pd for increased conductivity (FIG. 6). The aluminum phosphate film shows some crystalline structure with two distinct grain sizes (FIG. 6a). The image showing a larger area reveals that the annealed film, although homogeneous, contains a quite high amount of larger grains as defects (FIG. 6b). The annealed titanium phosphate film, on the contrary, shows very large crystals with voids in between (FIGS. 6c and 6d).

In conclusion, amorphous titanium and aluminum phosphate thin films have been deposited successfully by ALD. Aluminum phosphate thin films were obtained at deposition temperatures between 150 and 400° C. while titanium phosphate films grew between 275 and 450° C. The aluminum phosphate films contained substantial amounts of chlorine and hydrogen residues while the impurity contents for hydrogen, carbon and chlorine were low in the titanium phosphate thin films. In general, higher deposition temperatures resulted in films with lower impurity contents. Also the phosphorus content in the films increased with increasing deposition temperature. Aluminum phosphate films with stoichiometries of $Al_{2.6}PO_{7.0}$ and $Al_{1.6}PO_{5.6}$ were deposited at 200 and 300° C., respectively, while the titanium phosphate films deposited at 300 and 400° C. had stoichiometries of $Ti_{O0.8}PO_{3.9}$ and $Ti_{0.6}PO_{3.5}$ ($Ti_{1.2}P_2O_7$). The phosphate films were heat treated under $O_2$ and $N_2$ atmospheres to crystallize the amorphous as-deposited films. Aluminum phosphate film remained amorphous up to 875° C. in $O_2$ and 775° C. in $N_2$ atmosphere, while the higher temperatures resulted most likely in a mixture of various aluminum phosphate phases. The amorphous titanium phosphate film deposited at 400° C. crystallized first to cubic $TiP_2O_7$ between 725-775° C. and then decomposed via $Ti_4P_6O_{23}$ to $TiO_2$ above 1075° C.

ALD of Lithium Phosphates

Growth and characterization of lithium phosphate thin films deposited by ALD using only two precursors (a lithium precursor and a phosphate precursor, without a separate oxygen precursor) were analyzed. TMPO was used as a phosphate reactant with two lithium precursors, namely lithium tert-butoxide (LiO$^t$Bu) and lithium hexamethyldisilazide [LiHMDS, also known as lithium bis(trimethylsilyl)amide]. Earlier only the lithium bis(ethyldimethylsilyl)amide and diisopropylphosphate combination has been mentioned in the patent literature for ALD of lithium phosphate. See, for example, U.S. Pat. No. 6,969,539. This kind of two precursor ALD processes could be combined with other ALD processes to form more complex stoichiometries.

Film Deposition and Characterization

Thin films were grown in a commercial cross-flow F-120 ALD reactor (ASM Microchemistry Ltd., Finland) under a nitrogen pressure less than 10 mbar. Nitrogen was produced with a domnick hunter G2100E nitrogen generator and used as a carrier and a purging gas. Silicon (111) and soda lime glass (5×5 cm$^2$) were used as substrates in each deposition. The films were deposited using either lithium tert-butoxide (LiO$^t$Bu) or lithium hexamethyldisilazide [LiHMDS, Li(N(SiMe$_3$)$_2$)] as lithium sources while trimethyl phosphate [TMPO, (MeO)$_3$PO] (Merck, 97% and ABCR, 99%) was applied as a phosphate source. Both LiHMDS and LiO$^t$Bu were synthesized in-house, while commercial LiHMDS (Aldrich, 97% and ABCR) and LiO$^t$Bu (ABCR, 98%) were used in some depositions. LiHMDS and LiO$^t$Bu were sublimed from open source boats held inside the reactor at 60 and 90-110° C., respectively, and pulsed with inert gas valving. TMPO was evaporated inside the reactor as well keeping it at the room temperature.

In addition to LiO$^t$Bu and LiHMDS, also, Li(thd) (thd=2,2,6,6-tetramethyl-3,5-heptanedionato), Li(hfac) (hfac=1,1,1,5,5,5-hexafluoro-2,4-pentanedionato), Li($^t$Bu$_2$Cp), Li(acac) (acac=2,4-pentanedionato), Li(Piv)(H$_2$O) [Piv=pivalate, (CH$_3$)$_3$CCO$_2$-] were synthesized in-house using the reaction between butyllithium and appropriate ligand. Li(CH$_2$SiMe$_3$) was synthesized by reacting Li with ClCH$_2$SiMe$_3$. Thermogravimetric analyses (TGA) of the synthesized compounds were done on a Mettler Toledo Star$^e$ system equipped with a TGA 850 thermobalance. The TGA measurements were carried out at atmospheric pressure under a nitrogen flow. The heating rates were 10° C./min and the weights of the samples prepared to 70 μl pans were around 10 mg each.

Film thicknesses and refractive indices at a wavelength of 580 nm were evaluated from reflectance spectra measured between 370 and 1100 nm by a Hitachi U-2000 spectrophotometer. Some of the film thicknesses were also determined from X-ray reflectivity (XRR) patterns measured with a Bruker AXS D8 Advance diffractometer. Electric resistivity of the films was confirmed with a four-point probe technique.

Crystallinity of the films on Si substrates was examined with a PANalytical X'Pert Pro MPD X-ray diffractometer using CuK$_\alpha$-radiation. The measurements were conducted in grazing incidence mode (GIXRD)). High temperature X-ray diffraction (HTXRD) measurements were done in nitrogen atmosphere (99.999%, further purified with Entegris 35KF-I-4R inert gas purifier) using an Anton-Paar HTK1200N oven. Temperature was raised in 50° C. steps with a rate of 15° C./min and two minute waiting period preceded each 30 min measurement.

Elemental compositions of the films were determined with elastic recoil detection analysis (ERDA) using a 35 MeV Cl$^{7+}$ ion beam. The angle between the sample normal and the incoming beam was 75° while the scattering angle was 31°. The analyzed area in the measurement was about 1.5×1.5 mm$^2$. The recoil ions were detected with a Bragg Ionization Chamber using a full energy detection circuit and a fast timing circuit to obtain a Z dependent signal to separate ion species. Hydrogen and lithium were detected with a separate solid state detector preceded by an Al foil to stop other scattered and recoiled ions. The ERDA spectra and the RBS spectrum from Cl scattering were fitted simultaneously using the program NDF (N. P. Barradas, C. Jeynes and R. P. Webb, Appl. Phys. Lett., 1997, 71, 291-293).

Figure 7:
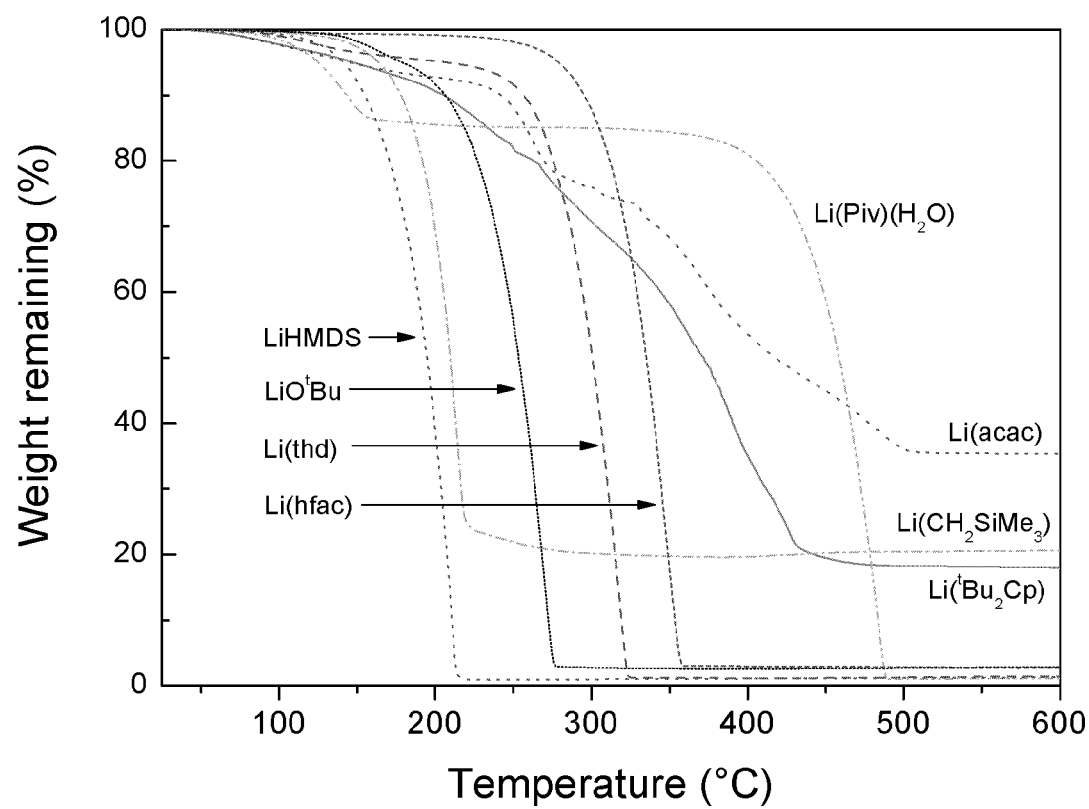
FIG. 7 shows TGA curves of Li(Piv)($H_2O$), Li(acac), Li($CH_2SiMe_3$), LiHMDS, LiO$^t$Bu, Li(thd), Li(hfac) and Li($^t$Bu$_2$Cp).

In order to find suitable lithium precursors for ALD, several compounds were evaluated using TGA measurements under flowing $N_2$ atmosphere (FIG. 7). TGA measurements are done to obtain information about the volatility and thermal stability of the precursor candidates. An ideal ALD precursor would show 100% weight loss in a single step at low temperature as this proves high volatility and stability. Of the examined lithium compounds, only LiHMDS, Li(O$^t$Bu), Li(thd), and Li(hfac) sublimed from the crucibles without any substantial residues. LiHMDS proved to be the most volatile, although all the fully sublimed lithium compounds have relatively low sublimation temperatures and are therefore well applicable in ALD. Li(piv)(H$_2$O) also sublimes without residue. At first Li(piv)(H$_2$O) loses H$_2$O at 100-170° C. and then at temperatures much higher (350-500° C.) compared to the other lithium compounds, Li(piv) sublimes. Li(CH$_2$SiMe$_3$), Li($^t$Bu$_2$Cp), and Li(acac) leave substantial residues of about 20% or above, and all expect Li(CH$_2$SiMe$_3$) show multi-step weight losses. Therefore rather than subliming, these compounds are decomposing during heating. As conclusion these lithium compounds are not considered as desirable for ALD as LiHMDS, Li(O$^t$Bu), Li(thd), and Li(hfac).

Figure 8:
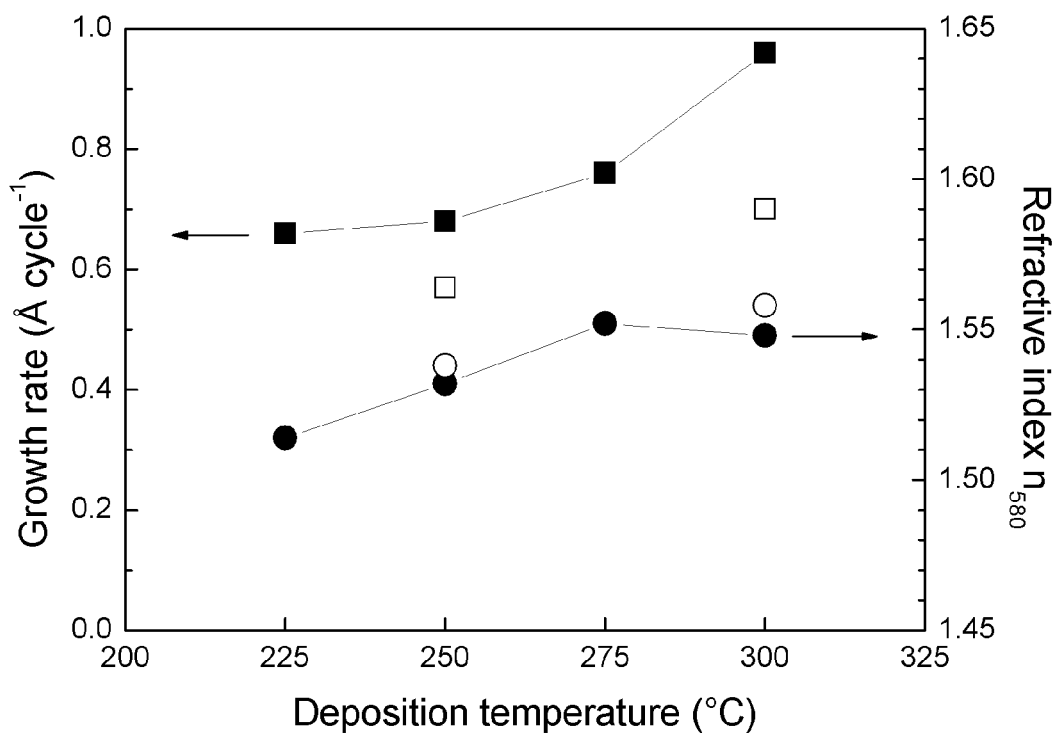
FIG. 8 shows growth rates and refractive indices of lithium phosphate films as a function of deposition temperature. The precursor pulses and purges were either 2 s (open symbol) or 4 s (solid) each. A total of 1000 cycles were applied for each deposition.
Figure 9:
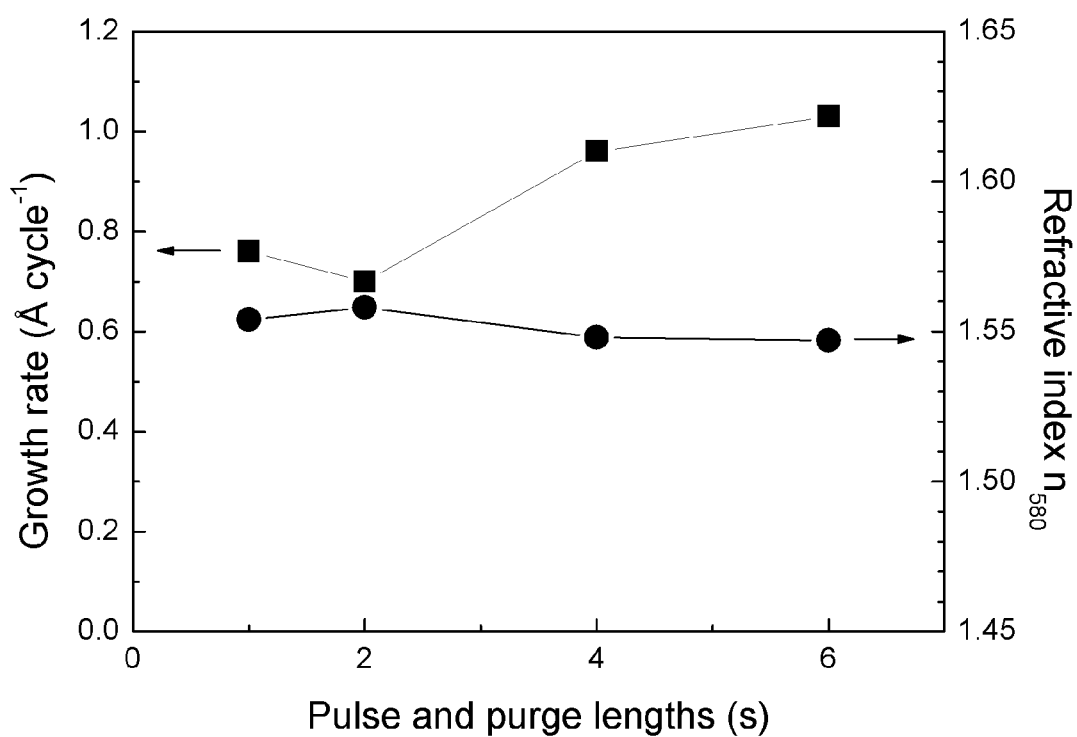
FIG. 9 shows growth rates and refractive indices of lithium phosphate films as a function of pulse and purge lengths of both precursors. 1000 cycles were applied in each run. The films were deposited at 300° C.

FIG. 8 presents the growth rates and refractive indices of lithium phosphate thin films deposited using LiO$^t$Bu and TMPO as a function of deposition temperature. The growth rate is about 0.7 Å/cycle between 225 and 275° C. and reaches roughly 1.0 Å/cycle at 300° C. when 4 s pulses and purges for both precursors are used. The film deposited at lower temperature (200° C.) was not homogeneous across the substrate, while at 350° C. LiO$^t$Bu decomposition, observed also at the hot end of the precursor tube, led to nonuniform film growth. The refractive index increases from 1.51 to 1.55 with increasing deposition temperature up to 275° C. Shortening the pulses and purges from 4 s to 2 s has no considerable impact on refractive indices, however, the growth rates decrease roughly 0.1 Å/cycle and 0.2 Å/cycle at 250 and 300° C., respectively. The effect of precursor pulse lengths and purges up to 6 s on growth rate and refractive index is shown in FIG.

9. With increasing pulse and purge lengths the growth rate reaches 1.0 Å/cycle with 6 s pulses and purges at 300° C. However, full saturation of the growth rate is not observed even with this high precursor doses. Most importantly, the pulse length does not have an influence on the refractive indices as the refractive index is 1.55-1.56 regardless the pulse and purge lengths. This would indicate that although full saturation is not achieved the film composition does not noticeably change with the applied pulse and purge lengths.

Figure 10:
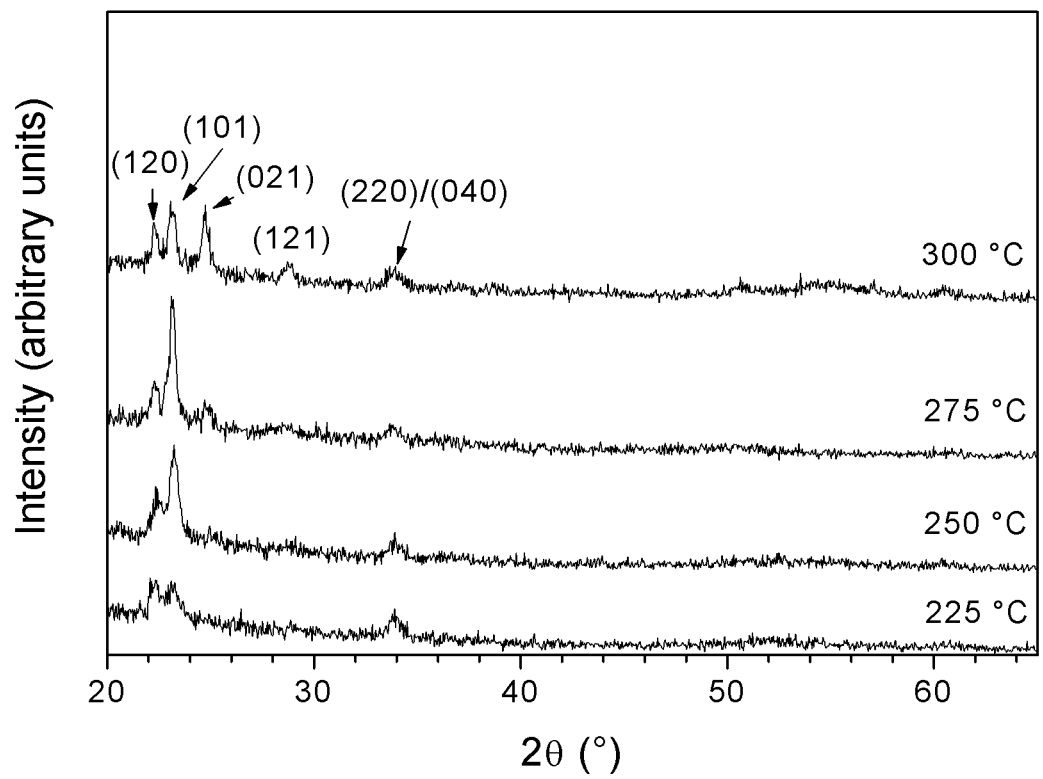
FIG. 10 shows GIXRD patterns of $Li_3PO_4$ films deposited from LiO$^t$Bu at various deposition temperatures with 4 s precursor pulse and purge lengths.
Figure 11:
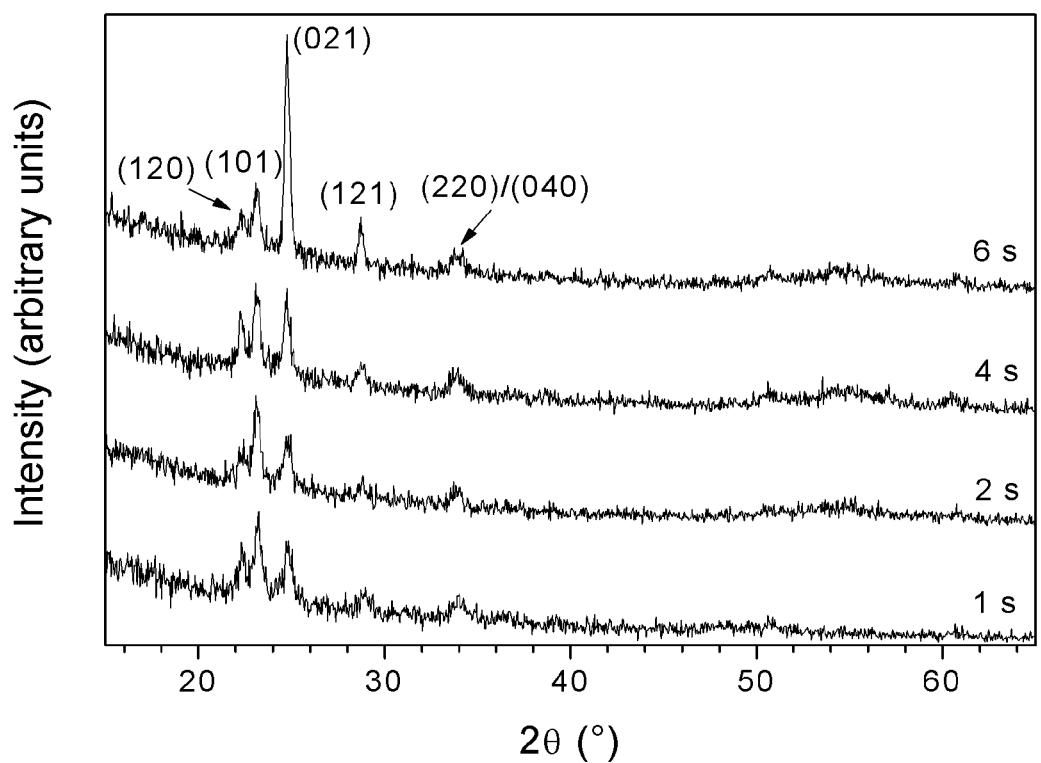
FIG. 11 shows GIXRD patterns of $Li_3PO_4$ films deposited at 300° C. with increasing precursor pulse and purge lengths.

GIXRD patterns of the films deposited at various temperatures show distinctive, yet quite low intensity peaks of $Li_3PO_4$ (FIG. 10). The $Li_3PO_4$ (121) reflection can be seen at the highest temperature (300° C.). Increasing the pulse and purge lengths to 6 s leads to more intense (021) and (121) peaks of $Li_3PO_4$ compared to the films deposited with shorter pulses and purges (FIG. 11).

Figure 12:
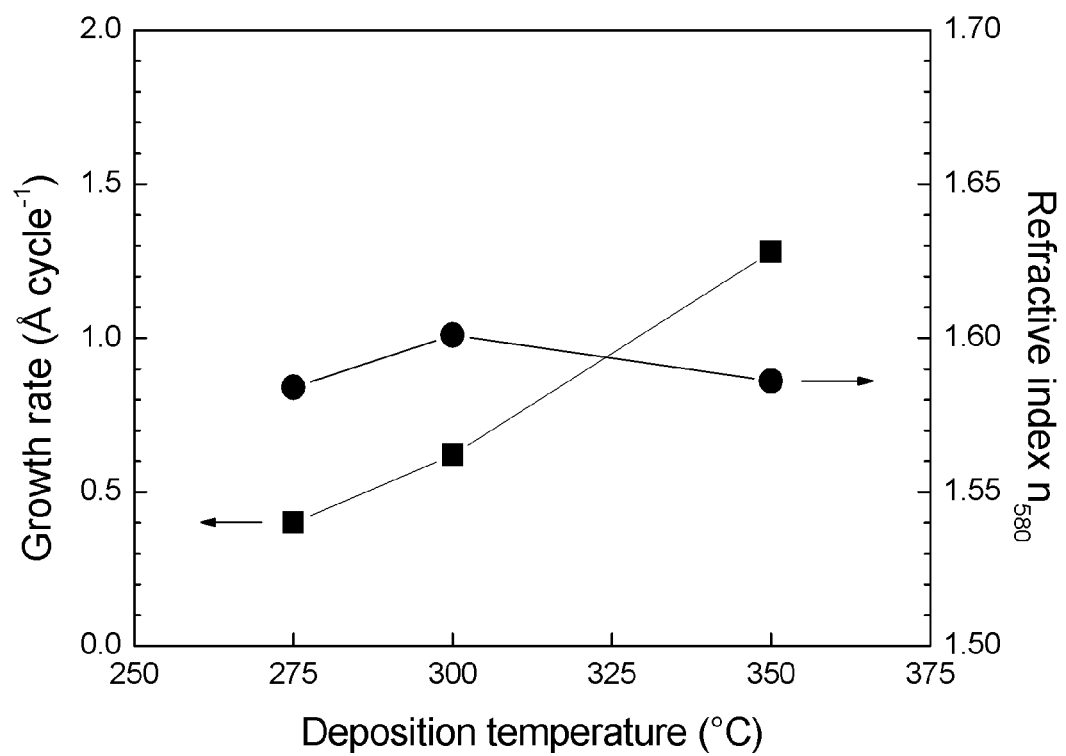
FIG. 12 illustrates growth rates and refractive indices of lithium phosphate films as a function of deposition temperature. The pulse and purge lengths for LiHMDS and TMPO were 2 s each. 1000 cycles were applied in each deposition.
Figure 13:
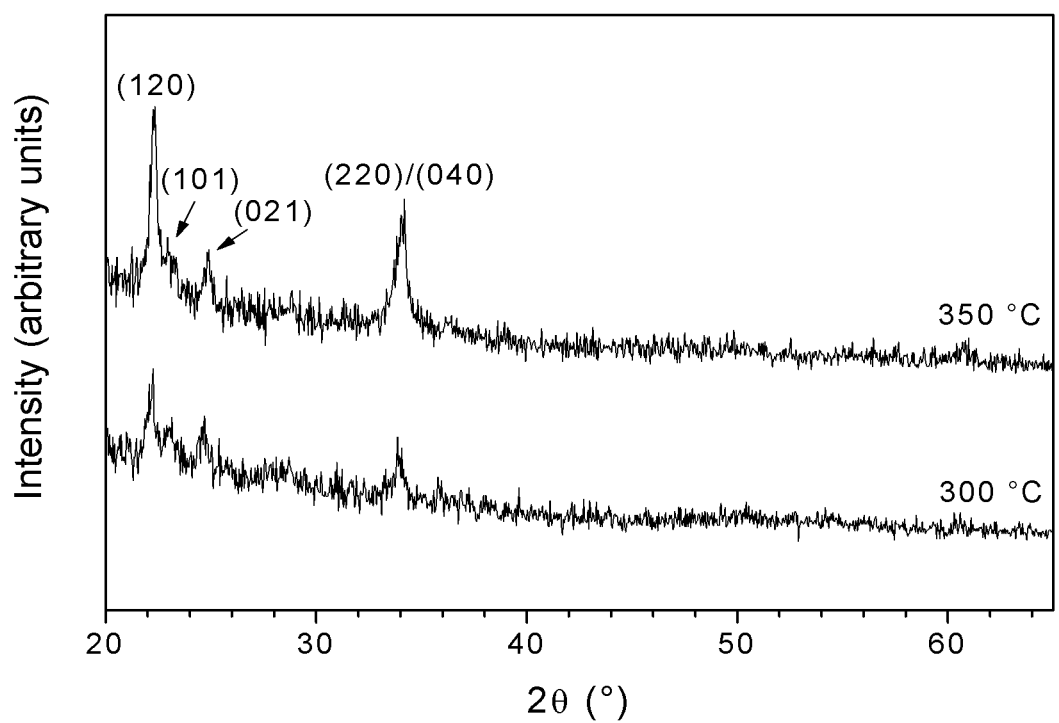
FIG. 13 illustrates GIXRD patterns of lithium phosphate films deposited at 300 and 350° C. on Si(111).

Lithium phosphate thin films were successfully deposited also using LiHMDS and TMPO as precursors between 275 and 350° C. by applying 2 s pulses and purges for both precursors (FIG. 12). Proper film growth was not observed at a lower deposition temperature of 250° C., while higher than 350° C. deposition temperatures were not used because slight coloration from LiHMDS decomposition was visible at the hot end of the source tube already at 350° C. The growth rate increases from about 0.4 Å/cycle up to around 1.3 Å/cycle between 275 and 350° C. At that temperature range the refractive index is between 1.58 and 1.60. The GIXRD patterns reveal more pronounced $Li_3PO_4$ (120) and $Li_3PO_4$ (220/040) orientations at 350° C. (FIG. 13) compared to the film deposited at 300° C. or the films deposited with LiO$^t$Bu (FIG. 10).

Elemental compositions of the lithium phosphate films were measured with ERDA (Table 2). The samples were prepared on Si(111) substrates and about 50 to 60 nm thick $Al_2O_3$ capping layers were deposited in-situ on top of the lithium phosphate films. The concentrations presented in Table 2 are averages from the whole lithium phosphate layers. The average composition of the films was not easy to calculate, however. The transition between the $Al_2O_3$ capping layer and the lithium phosphate film layer was not sharp because of the limited depth resolution of the measurement while also roughness of the $Li_3PO_4$—$Al_2O_3$ interface may have influenced the measurement.

The films grown using LiO$^t$Bu as the lithium source show that the carbon and hydrogen impurities decrease from 3.6 to 2.7 at % and from 8.1 to 5.1 at %, respectively, as the deposition temperature is increased from 250 to 300° C. (Table 2). Relative to the phosphorus, the lithium and oxygen contents decrease as well with increasing deposition temperature. In the film deposited at 250° C. the Li/P ratio is 2.8, which is slightly lower than in the crystalline $Li_3PO_4$ (Li/P 3), and at the higher deposition temperature (300° C.) the Li/P ratio decreases to 2.6. In comparison to the stoichiometric O/P ratio of 4 in crystalline $Li_3PO_4$, the film deposited at 250° C. has a bit too high oxygen content (O/P 4.4) while the film deposited at 300° C. is already slightly oxygen deficient (O/P 3.7).

On the other hand, the films deposited with LiHMDS as the lithium precursor at 275 and 300° C. are very close to the stoichiometric $Li_3PO_4$ in respect of both Li/P and O/P ratios (Table 2). However, the films contain quite high carbon (6.2 and 8.2 at %) and hydrogen impurity contents (6.6 and 7.0 at %). Although noticeable precursor decomposition was not observed at 300° C., the increase of impurities with increasing deposition temperature could be an indication of a slight decomposition as observed at 350° C.

TABLE 2

Elemental compositions of the lithium phosphate thin films deposited using either LiO$^t$Bu or LiHMDS precursors as measured with ERDA.

| dep. temp. (° C.) | Li (at %) | P (at %) | O (at %) | C (at %) | H (at %) | Mg (at %) | Li:P:O ratio |
|---|---|---|---|---|---|---|---|
| LiO$^t$Bu | | | | | | | |
| 250 | 29.2 | 10.6 | 46.9 | 3.6 | 8.1 | 1.6 | 2.8:1:4.4 |
| 300 | 32.6 | 12.4 | 46.2 | 2.7 | 5.1 | 0.9 | 2.6:1:3.7 |
| LiHMDS | | | | | | | |
| 275 | 31.6 | 10.9 | 44.2 | 6.2 | 6.6 | 0.5 | 2.9:1:4.1 |
| 300 | 30.1 | 10.9 | 42.8 | 8.2 | 7.0 | 0.65 | 2.8:1:3.9 |

The films deposited with both processes were found to contain a small amount of unexpected contaminant with a concentration of 0.5 to 1.6 at % according to the ERDA measurements. Although the contaminant seemed to be magnesium, this could not be verified due to a lack of calibration data. The origin of the magnesium in the films is unknown. Notably, nitrogen was below the detection limit of about 0.2 at % in all films even if LiHMDS contains nitrogen.

The $Li_3PO_4$ films grown from both lithium precursors were resistive as sheet resistances of the films could not be measured with four-point probe. The long term stability of the films is questionable as the films start to show subtle signs of degradation already after a couple of days in ambient air. Pieces of the $Li_3PO_4$ films deposited at 300° C. on Si substrates were exposed to about 60% moisture for a week while rest of the samples were stored in a desiccator containing silica gel as a drying agent. The films exposed to moisture were visually different compared to the reference samples stored in the desiccator indicating that moisture is one of the causes for the degradation of the films in ambient atmosphere. In fact, photoluminescence-type gas sensor based on hollow $Li_3PO_4$ nanospheres is considered as an optical humidity sensor.

Figure 14:
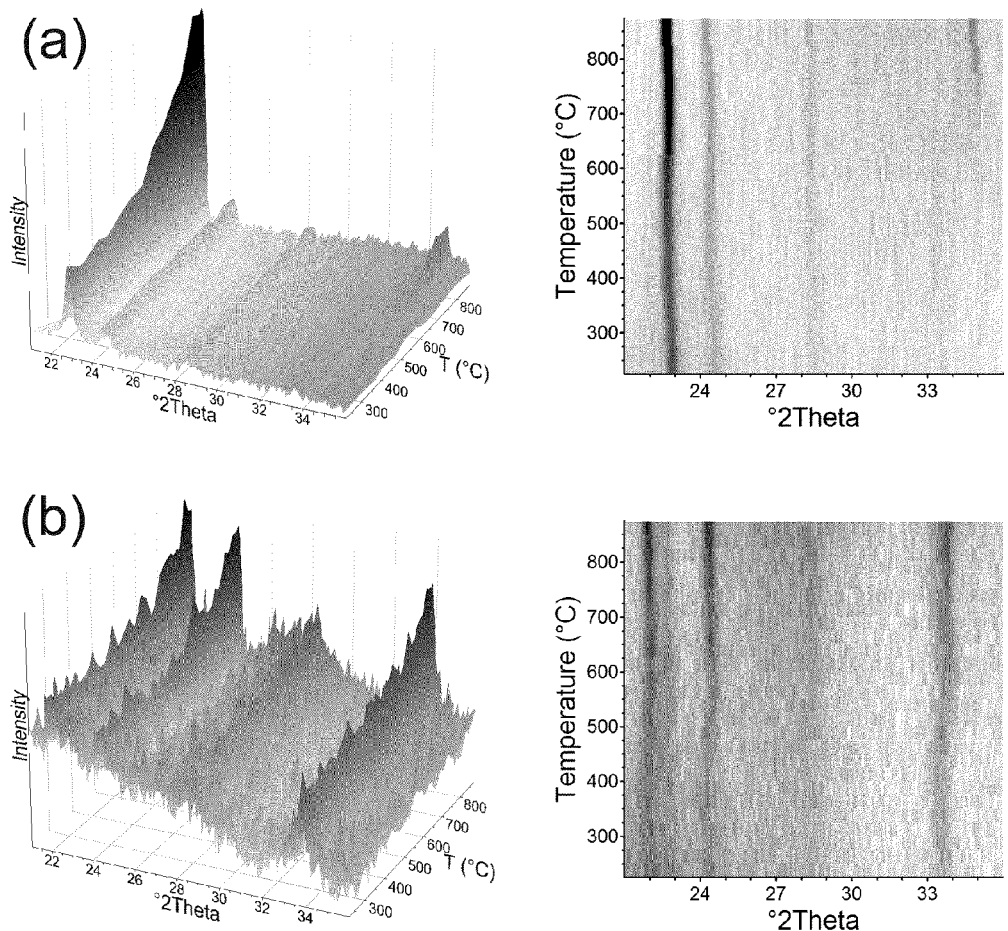
FIG. 14 shows HTXRD patterns of $Li_3PO_4$ films annealed in $N_2$. The films were deposited at 300° C. using either LiO$^t$Bu (FIG. 14A) or LiHMDS (FIG. 14B) as the lithium precursor.
Figure 15:
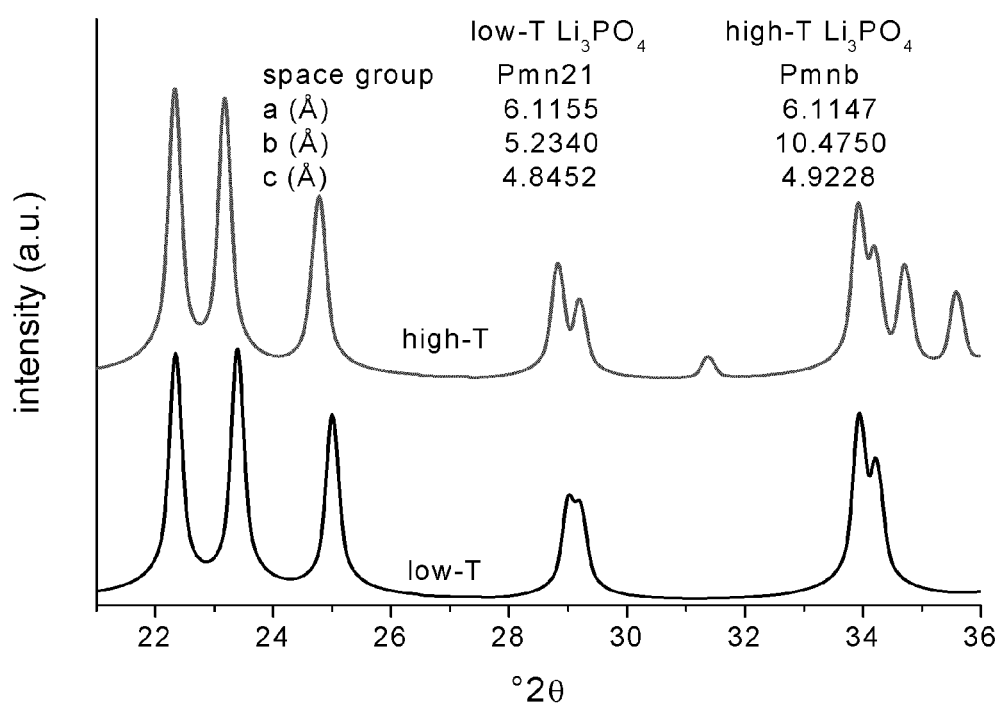
FIG. 15 shows a comparison of the simulated diffractograms of β-$Li_3PO_4$ (low-T) and γ-$Li_3PO_4$ (high-T).

Samples from both processes were subjected to HTXRD measurements under $N_2$ to examine the stability of the films at elevated temperatures (FIG. 14). Both samples grown at 300° C. were identified as an orthorhombic $Li_3PO_4$; the film deposited with LiO$^t$Bu is slightly (101) oriented (FIG. 14a) while LiHMDS produces a film which is more randomly oriented but far less crystalline (FIG. 14b). In both cases the reflection positions shift in nonlinear manner during heating, but the orthorhombic phase remains up to 875° C. Possible reason for the peak shifting could be related to an irreversible transformation from the low temperature β-$Li_3PO_4$ (Pmn21) to the high temperature γ-$Li_3PO_4$ (Pmnb) that has been reported to occur between 400-600° C. Most likely the reason is transformation of a mixture of low and high temperature forms to high temperature form only (FIG. 15). Other possible explanations include lattice disturbations due to impurities and their diffusion in the lattice, and effect of amorphous phase "merging" with more crystalline part of the film.

Figure 16:
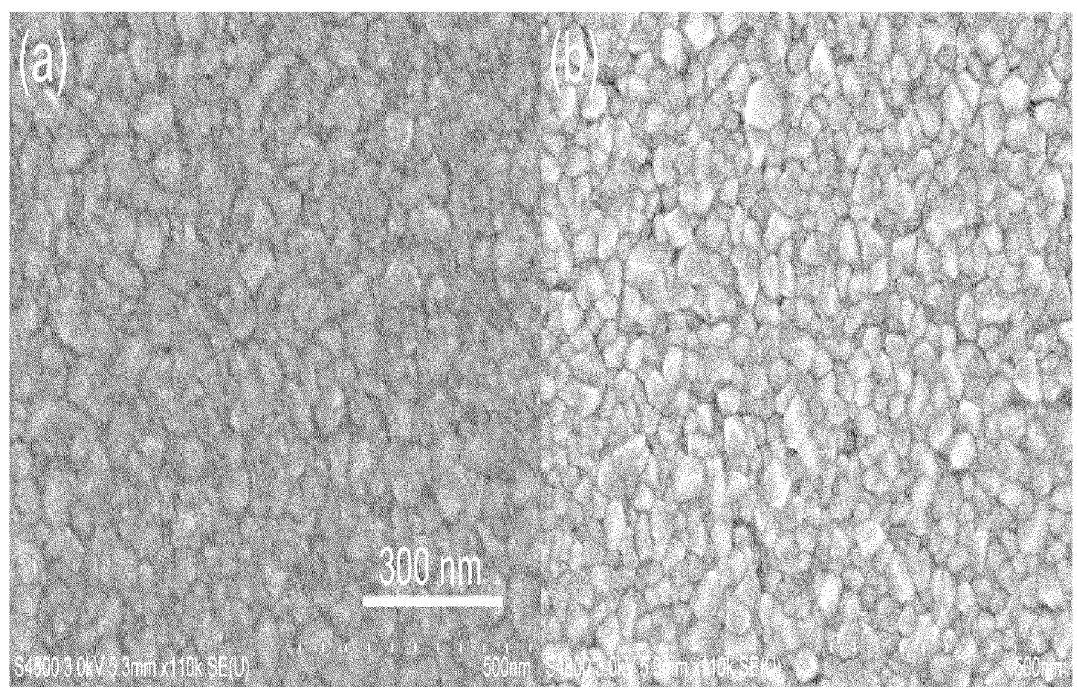
FIG. 16 shows FESEM images of a $Li_3PO_4$ film as deposited (FIG. 16A) and annealed (FIG. 16B) at 800° C. under $N_2$ flow. The film was deposited at 300° C. using LiO$^t$Bu as the lithium source. A Pt/Pd coating about 1 nm thick was deposited on top of the samples before imaging.

As seen from FIG. 14, both films crystallize more intensely above 600° C. In the case of the film grown using LiO$^t$Bu an additional reflection appears at 34.8° 2θ which is from the high temperature γ-$Li_3PO_4$ phase (FIG. 15). The HTXRD patterns taken at temperatures higher than 875° C. showed peaks which were hard to interpret unambiguously. Comparison of the FESEM images of the as-deposited film to the film annealed up to 800° C. in HTXRD measurements (FIG. 16) shows that the annealed film has more pronounced grain structure because of the crystallization at elevated temperatures as indicated by the HTXRD measurements.

In conclusion, $Li_3PO_4$ thin films were deposited by ALD using TMPO and either LiO$^t$Bu or LiHMDS as the lithium source. The films grew between 225 and 300° C. with the LiO$^t$Bu-TMPO ALD process while the LiHMDS-TMPO process produced films between 275 and 350° C. The films contained about 30 at % lithium with some carbon (3-8 at %) and hydrogen (5-8 at %) impurities. The LiO$^t$Bu-TMPO process produced films at lower temperature and had lower carbon content than the LiHMDS-TMPO process. Although near stoichiometric $Li_3PO_4$ was obtained with both ALD processes developed, there are unresolved questions about the long term stability of the films in the ambient conditions. This concern may be addressed, for example, by either thin capping layers or by doping the films.

ALD of Lithium Silicates

Lithium silicate thin films, which are interesting materials for example in lithium ion batteries, were grown by the atomic layer deposition (ALD) technique from lithium hexamethyldisilazide [LiHMDS, $Li(N(SiMe_3)_2)$] and ozone precursors. Films were obtained at a wide deposition temperature range between 150 and 400° C. All the films were amorphous except at 400° C. where partial decomposition of LiHMDS was also observed. The growth behavior of the process was examined at 250° C. in detail, and saturation of precursor doses with self-limiting surface reactions in respect of growth rates and refractive indices was confirmed. Likewise linear thickness dependence of the films with increasing number of deposition cycles was studied. Strong dependence of growth rate and composition of the films on deposition temperature was also seen. Overall, the amorphous films grown at 250° C. had a stoichiometry close to lithium metasilicate ($Li_{2.0}SiO_{2.9}$) with respective 0.7 and 4.6 atom % carbon and hydrogen impurity content. The corresponding growth rate and refractive index ($n_{580}$) were 0.8 Å/cycle and about 1.55.

Lithium silicate films obtained using atomic layer deposition (ALD) from LiHMDS and ozone were studied at a wide deposition temperature range. The growth rates and refractive indices are reported below, as well the compositional analysis of the films deposited at various temperatures. The ALD grown thin films inherently possess good conformality and uniformity because of the alternating, saturative precursor doses and self-limiting surface reactions. See, for example, N. P. Barradas, C. Jeynes and R. P. Webb, Appl. Phys. Lett., 1997, 71, 291-293 and M. Ritala and J. Niinisto, in Chemical Vapor Deposition: Precursors, Processes and Applications, A. C. Jones and M. L. Hitchman, Editors, p. 158, The Royal Society of Chemistry, Cambridge, UK (2009). This results in accurate thickness controllability and repeatability of the films because of the layer by layer approach. Therefore films with specific thicknesses can be deposited on demanding structures with large surface areas, which could be used to effectively increase the energy storage capacity of the battery applications.

Film Deposition and Characterization.

Thin films were grown in a commercial cross-flow F-120 ALD reactor (ASM Microchemistry Ltd.) equipped with a quartz cassette substrate holder under a nitrogen pressure of about 10 mbar. Nitrogen was produced with a domnick hunter G2100E nitrogen generator and used as a carrier and a purging gas in the ALD reactor. Two 5×5 cm$^2$ silicon (111) substrates were used in most depositions, while also a soda lime glass was applied in some experiments in place of a Si substrate. The films were grown using lithium hexamethyldisilazide [LiHMDS, $Li(N(SiMe_3)_2)$, also known as lithium bis (trimethylsilyl)amide] and ozone as precursors. LiHMDS (Aldrich, 97%) was sublimed from an open source boat held inside the reactor at 60° C. and pulsed with inert gas valving. Some LiHMDS was also synthesized in-house according to the literature for molecular structure determination (description below). Ozone was produced with a Wedeco Ozomatic Modular 4 HC Lab ozone generator from oxygen (99.999%, Linde Gas) and pulsed from the main ozone flow line into the reactor through a needle valve and a solenoid valve.

Film thicknesses and refractive indices at a wavelength of 580 nm were evaluated from reflectance spectra measured mostly between of 190 and 1100 nm by a Hitachi U-2000 spectrophotometer (M. Ylilammi and T. Ranta-aho, Thin Solid Films, 232, 56 (1993)). Crystallinity of the films was determined with a PANalytical X'Pert Pro X-ray diffractometer in grazing incidence mode (GIXRD)). Adhesion of the films to Si was tested with a common Scotch tape test. Electric resistivity of the films was confirmed with a four-point probe technique.

Elemental compositions of the films were determined with elastic recoil detection analysis (ERDA) using a 35 MeV $Cl^{7+}$ ion beam. The recoil ions were detected with a Bragg Ionization Chamber using a full energy detection circuit and a fast timing circuit to obtain a Z dependent signal to separate ion species. Hydrogen and lithium were detected with a separate solid state detector preceded by a Mylar foil to stop other scattered and recoiled ions. The ERDA spectra and the RBS spectrum from Cl scattering were fitted simultaneously using the program NDF.

Single-Crystal X-Ray Structure Determination.

Single crystals of $[Li(N(SiMe_3)_2)]_3$ suitable for X-ray diffraction were obtained from hexane solution. The crystals were mounted on a glass fiber with the viscous oil-drop method. The equipment used was Bruker Nonius KappaCCD diffractometer (MoK$\alpha$, X=0.71073 Å). Area-detector scaling and absorption corrections were done with a program SADABS. G. M. Sheldrick, SADABS, a software for empirical absorption correction, University of Gottingen, Gottingen, Germany, 2000. Structures were solved and refined with the SHELX97 software package (G. M. Sheldrick, Acta Crystallogr., Sect. A, 64, 112 (2008)). All non-hydrogen atoms were refined anisotropically while H atoms were calculated according to the ideal geometry. Illustrations were produced by the SHELXTL program. Bruker AXS, Analytical Instrumentation, Madison, Wis., USA, 2000.

(LiHMDS).

$C_{18}H_{54}Li_3N_3Si_6$, M=502.00, crystal dimensions 0.4×0.4× 0.4 mm, monoclinic, $\alpha$=8.5950(17) Å, b=31.384(6) Å, c=12.187 Å, ft=104.03(3)°, U=3189.4(11) Å$^3$, $\rho_{calc}$=1.045 g cm$^{-3}$, $2\theta_{max}$=55.02°, T=123(2) K, space group P2$_1$/c (no. 14), Z=4, $\mu$(Mo—K$\alpha$) XX, 43382 reflections measured, 7184 being unique ($R_{int}$=0.0259), and used in all calculations. The final wR(F$^2$) and R(F$^2$) were 0.1317 and 0.0481 (all data), respectively. Crystallographic data (excluding structure factors) have been deposited with the Cambridge Crystallographic Data Centre as supplementary publication no. CCDC-833252.

Figure 17:
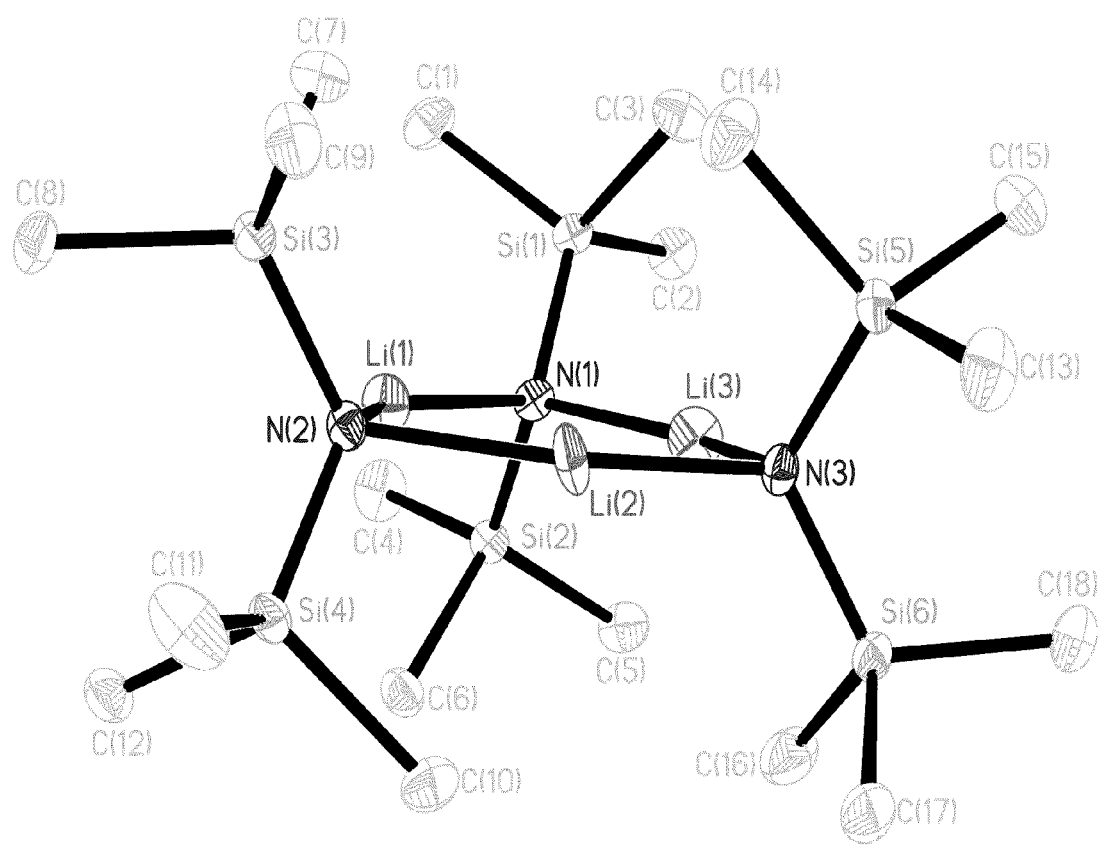
FIG. 17 illustrates the molecular structure of [Li(N(SiMe$_3$)$_2$)]$_3$. Thermal ellipsoids are drawn on the 50% level and hydrogen atoms are omitted for clarity.

The crystal structure of LiHMDS is provided. LiHMDS is trimeric in solid state (FIG. 17). The structure has been reported already in 1969 by Von Mootz et al. (Chem., 81, 398 (1969)) and our structure determination gave similar results. However in Cambridge Crystallographic Database there is no coordinates available and because of that we deposited the data into the database.

Figure 18:
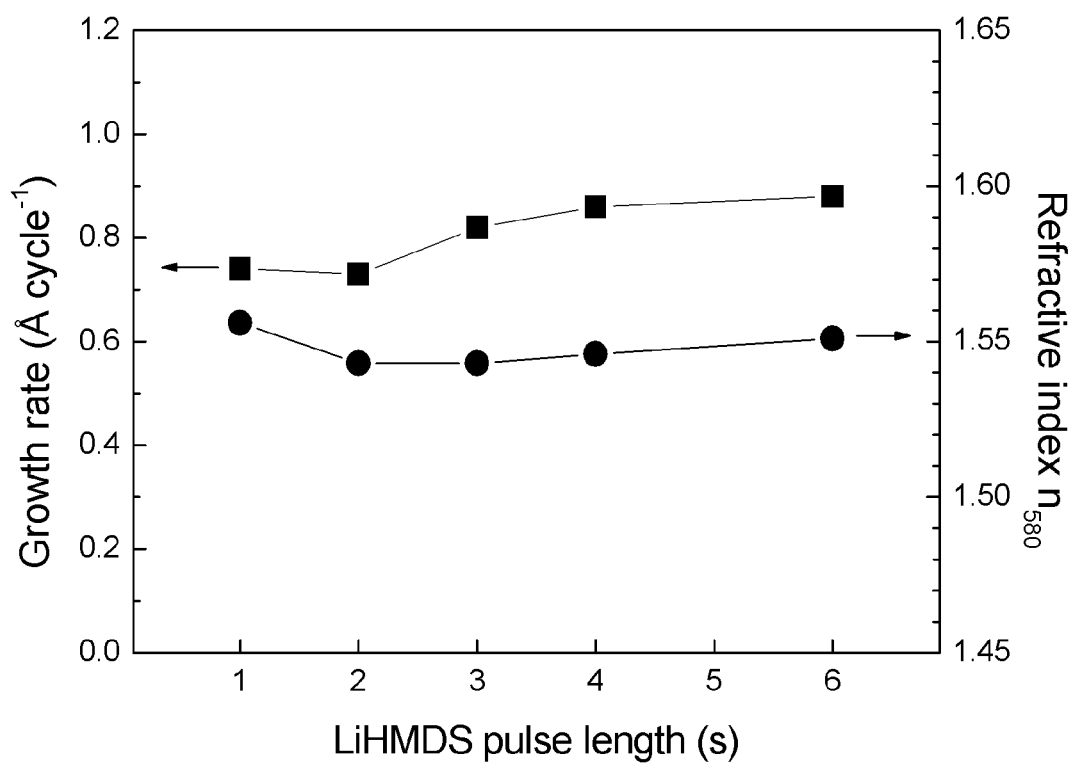
FIG. 18 shows the growth rate and refractive index of the lithium silicate films at 250° C. as a function of LiHMDS pulse length. The pulse length for ozone was 2 s. All the purges were 1 s each. 1000 cycles were applied in each deposition.
Figure 19:
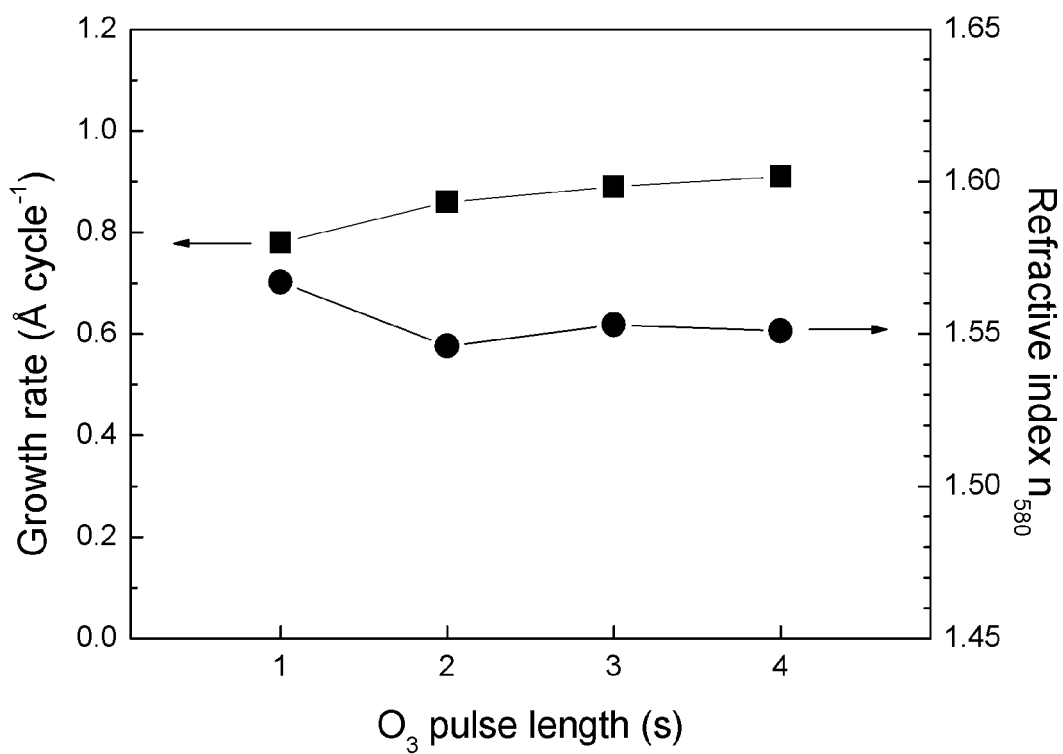
FIG. 19 shows the growth rate and refractive index of lithium silicate films at 250° C. as a function of ozone pulse length. The pulse length for LiHMDS was 4 s. All of the purges were 1 s each. 1000 cycles were applied in each deposition.

Lithium silicate films were deposited using LiHMDS and ozone as precursors. FIG. 18 presents growth rates and refractive indices of lithium silicate films as a function of LiHMDS pulse length at 250° C. The growth rate is about 0.7 Å/cycle with LiHMDS pulse length of 2 s or less and stabilizes to 0.8-0.9 Å/cycle between 3 and 6 s. The refractive index is 1.54-1.55 with pulse lengths of 2 s or more. With 1 s LiHMDS pulse the refractive index seems to be slightly higher (1.56). Similar results are obtained when varying the ozone pulse length (FIG. 19). The growth rate is around 0.8 Å/cycle with ozone pulses of 2 s or more; although the growth rate seems to increase still slightly with increasing ozone pulse length. The use of 1 s ozone pulse lengths results in a small decrease in growth rate, however the films are still uniform across the substrate. The films deposited with 1 s ozone pulses have also a bit higher refractive index (1.57) compared to the films obtained with longer ozone exposures (1.55). Overall, the results on both precursor pulse lengths indicate that the process is well controllable and follows the basic principles of film saturation as characteristic in ALD.

Figure 20:
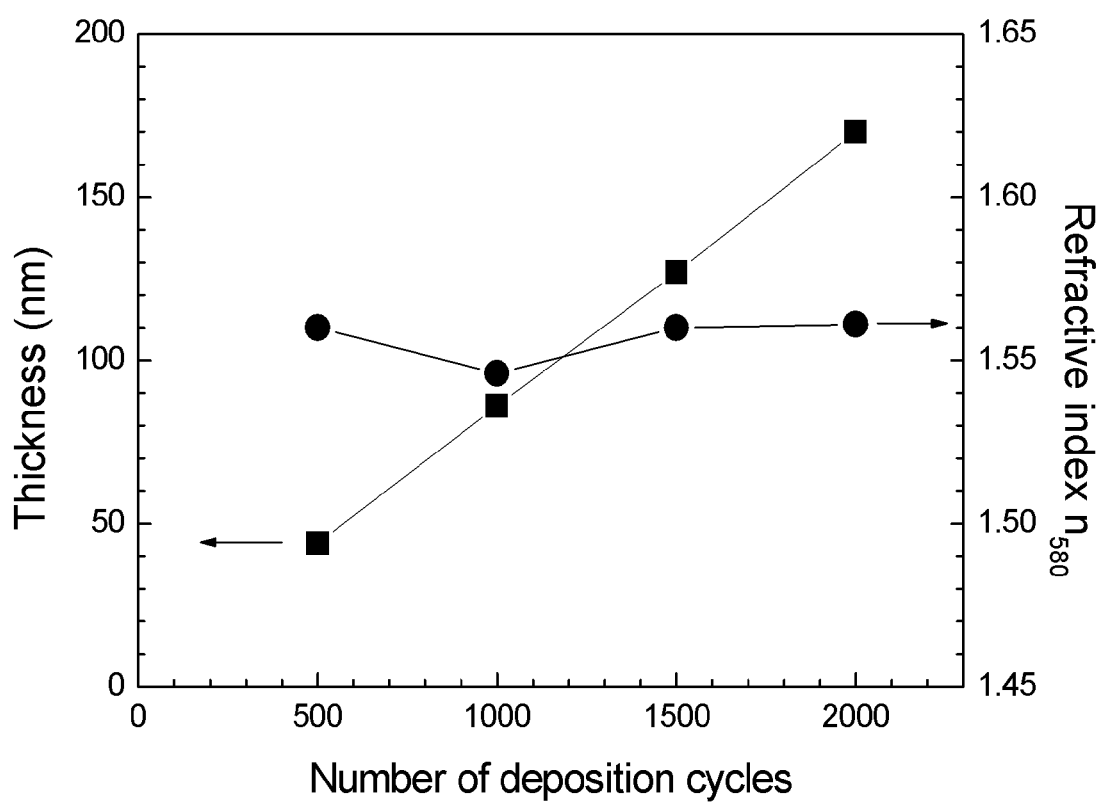
FIG. 20 shows the thickness and refractive index of lithium silicate films at 250° C. as a function of number of deposition cycles. The pulse lengths for LiHMDS and ozone were 4 s and 2 s, respectively, with 1 s purges.
Figure 21:
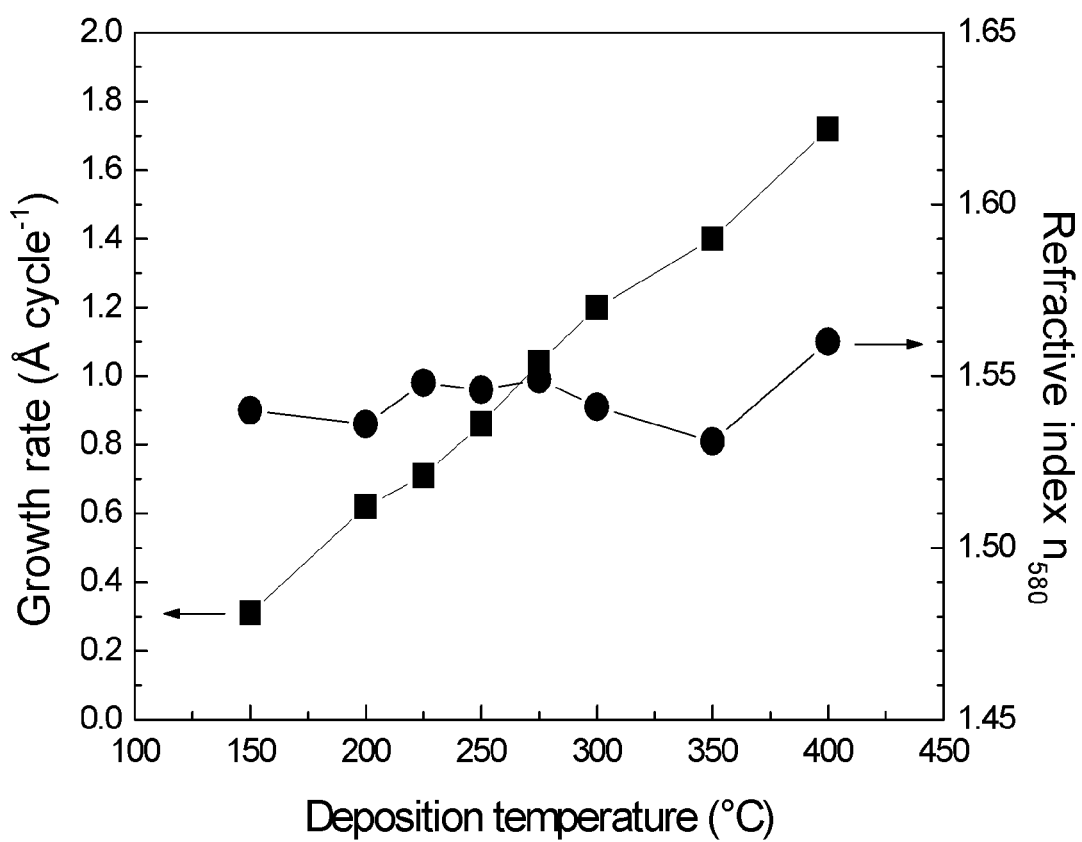
FIG. 21 shows the growth rates and refractive indices of lithium silicate films as a function of deposition temperature. The pulse lengths for LiHMDS and ozone were 4 s and 2 s, respectively, with 1 s purges. 1 000 cycles were applied for all depositions except at 150° C., where 2000 cycles were used.

The LiHMDS-ozone process seems to comply with the general characteristics of ALD in respect of constant growth rate due to saturative precursor doses and self-limiting surface reactions (FIGS. 18 and 19), and the linear dependence of film thickness with increasing number of deposition cycles at 250° C. (FIG. 20). However, the growth rate of the ALD lithium silicate process was found to be strongly dependent on the deposition temperature (FIG. 21). The growth rate increases quite linearly with increasing deposition temperature from 0.3 Å/cycle at 150° C. up to 1.7 Å at 400° C. This means that the LiHMDS-ozone process is lacking the classical ALD temperature window found in most ALD oxide processes. The refractive indices of the films on the other hand have a constant value over a large deposition temperature range. A plateau for refractive index (1.55) is found between 225 and 275° C., however in a deposition temperature range between 150 and 300° C. the refractive index is still within the experimental error margins. The refractive index seems to slightly decrease between 275 and 350° C., which may indicate compositional changes in the films grown at higher temperatures. The sudden increase in refractive index at 400° C. is most likely related to the partial decomposition of LiHMDS, observed also as a darker shade in the hot end of the precursor tube after deposition. However this was not detrimental to the film uniformity and did not result in increased carbon contamination in the film (to be discussed later).

Next, the effect of number of deposition cycles on film thickness and refractive index was examined at 250° C. As seen from FIG. 20, the film thickness is related to the number of deposition cycles applied without any noticeable incubation delay as characteristic for ALD oxide processes. The refractive index also remains stable between 1.55-1.56, which is in good agreement with the refractive indices obtained with varying precursor pulse lengths (FIGS. 18 and 19).

Figure 22:
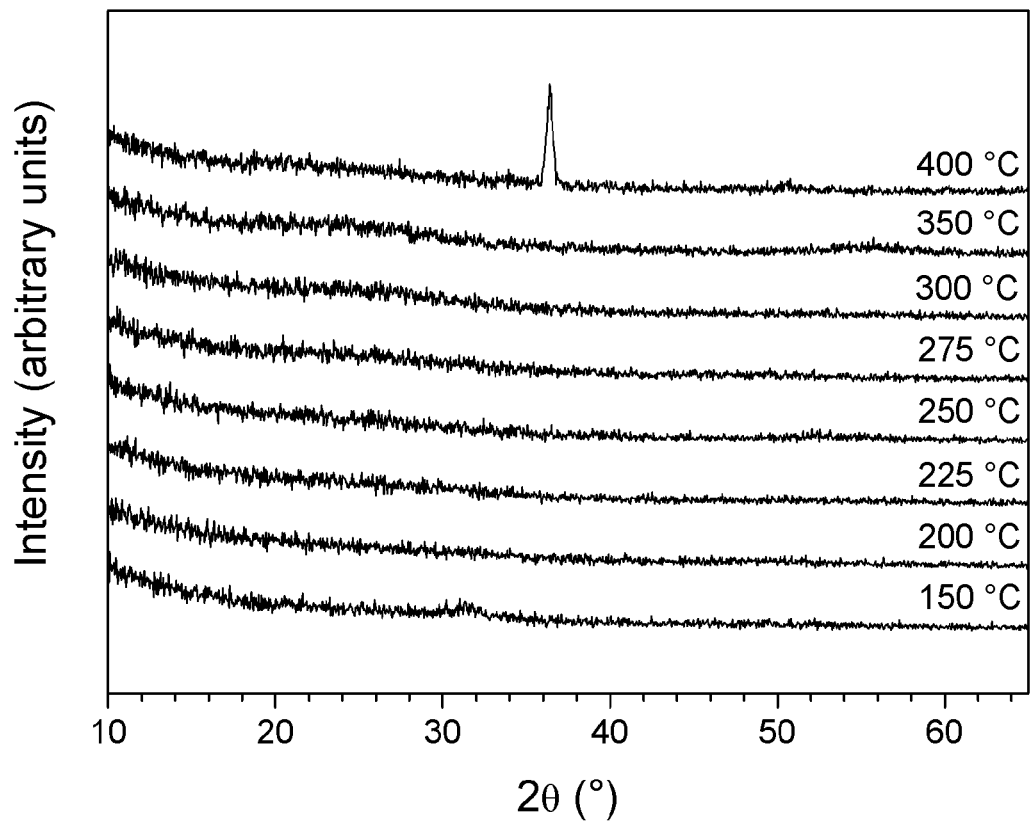
FIG. 22 shows a GIRXD pattern of lithium silicate films at several deposition temperatures. Deposition parameters were the same as in FIG. 21.

The films are X-ray amorphous when deposited between 150 and 350° C. (FIG. 22); however an unidentifiable peak is visible in the pattern of a film deposited at 400° C. As noticeable decomposition was observed at this deposition temperature, it may be suggested that this crystallinity is caused by a CVD component in the film growth process. The films were electrically resistive according to the four point probe measurements. Only the films deposited at the lowest temperatures showed faint electrical conductivity, which could not be determined reliably however.

The elemental compositions of the films deposited at various temperatures are presented in Table 3. The film deposited at 150° C. shows considerable carbon (about 4 atom %) and hydrogen (about 9 atom %) impurity contents. The carbon content decreases with increasing deposition temperature being less than one atom % in all the films deposited at 200° C. and above. Also the hydrogen content decreases with increasing temperature, however, the film deposited at 250° C. contains still quite high amount of hydrogen (4.6 atom %). The composition of the films varies as a function of deposition temperature. The Li/Si ratio decreases with increasing temperature from 2.8 (150° C.) to 1.6 (350° C.). The 0/Si ratio shows a similar tendency decreasing from 4.0 to 2.7. The higher Li/Si and O/Si ratios at 400° C. are likely a result of a partial decomposition of LiHMDS.

Figure 23:
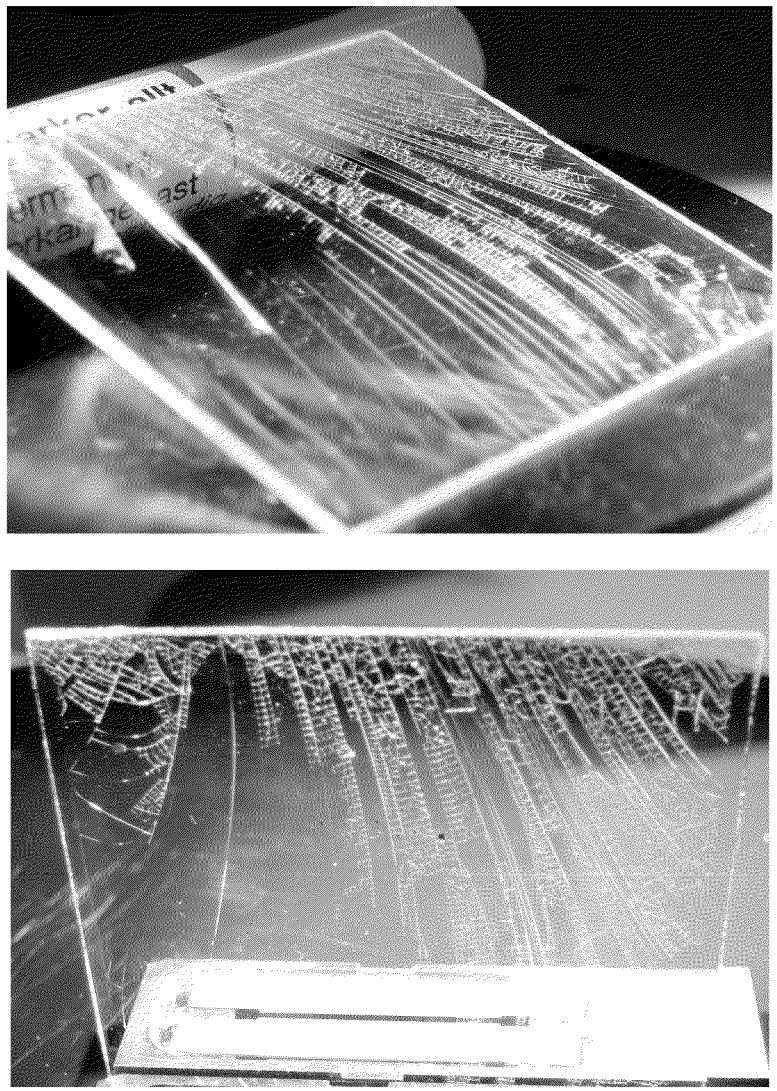
FIG. 23 shows images of the soda lime glass substrates after atomic layer deposition of a lithium silicate film at 300° C.

The densities of the films were calculated from the measured film thicknesses (nm) and the thicknesses obtained from ERDA measurements (atoms/cm$^2$) (Table 3). The film densities increase from 2.26 to 2.39 g/cm$^3$ between 200 and 350° C. The slightly higher densities at 150 and 400° C. are most likely result of substantially higher Li/Si ratios in the films, however at 150° C. higher carbon and hydrogen impurity contents may have also contributed. Overall, the films deposited at 250° C. show a stoichiometry of $Li_{2.0}SiO_{2.9}$, which is in a good agreement with the stoichiometry of lithium metasilicate ($Li_2SiO_3$). The film deposited at 300° C. is already showing slightly decreased Li and O contents ($Li_{1.7}SiO_{2.8}$) compared to $Li_2SiO_3$. Also an additional ERDA measurement was carried out from a lithium silicate film deposited at 300° C. on top of about 150 nm thick $Ta_2O_5$. The analyzed ~360 nm thick film showed substantially lower lithium content ($Li_{1.0}SiO_{2.9}$) compared to the film grown on Si in Table 3 ($Li_{1.7}SiO_{2.8}$). The reason for this lithium content reduction is currently unknown. However as lithium is known as an easily moving ion due to its small size, lithium might have migrated into $Ta_2O_5$. In fact, the lithium ionic conductivity of lithium silicates has been shown to be improved in the presence of ozone. Also the soda lime glasses used in some growth experiments suffer from quite dramatic cracking after the lithium silicate deposition (FIG. 23), which is most likely caused by the lithium ion migration into the glass.

TABLE 3

Elemental compositions of the lithium silicate thin films as measured with ERDA.

| | dep. temp. | | | | | |
|---|---|---|---|---|---|---|
| | 150° C. | 200° C. | 250° C. | 300° C. | 350° C. | 400° C. |
| Li (atom %) | 31.8 | 29.8 | 32.5 | 30.8 | 30.0 | 37.5 |
| Si (atom %) | 11.2 | 13.9 | 16.1 | 17.7 | 18.5 | 15.1 |
| O (atom %) | 44.2 | 48.7 | 46.3 | 48.6 | 49.6 | 45.9 |
| C (atom %) | 3.94 | 0.96 | 0.65 | 0.32 | 0.14 | 0.15 |
| H (atom %) | 8.78 | 6.63 | 4.60 | 2.70 | 1.71 | 1.29 |
| thickness (nm) | 62 | 62 | 86 | 120 | 140 | 172 |
| density (g/cm$^3$) | 2.48 | 2.26 | 2.32 | 2.36 | 2.39 | 2.45 |
| Li:Si:O ratio | 2.8: 1:4.0 | 2.1: 1:3.5 | 2.0: 1:2.9 | 1.7: 1:2.8 | 1.6: 1:2.7 | 2.5: 1:3.0 |

Close to stoichiometric $Li_2SiO_3$ at 250° C. Densities based on thicknesses from UV-vis (nm) and ERDA (at/cm$^2$)

Thus, lithium silicate films were successfully deposited between 150 and 400° C. from LiHMDS and ozone. The films deposited at 250° C. were shown to be grown in a saturative and controllable manner as expected in ALD. The growth rate of the LiHMDS-O$_3$ process was strongly dependent on the deposition temperature and increased from 0.3 Å/cycle up to 1.7 Å/cycle between 150 and 400° C. Also the stoichiometries of the films changed with increasing temperature. The amorphous films deposited at 250° C. had a growth rate of 0.8 Å/cycle, refractive index of about 1.55 ($n_{580}$) with stoichiometry close to lithium metasilicate ($Li_2SiO_3$). The carbon and hydrogen contents were 0.7 and 4.6 atom %, respectively.

It will be appreciated by those skilled in the art that various modifications and changes can be made without departing from the scope of the invention. Similarly, other modifications and changes are intended to fall within the scope of the invention, as defined by the appended claims.

What is claimed is:

1. An atomic layer deposition (ALD) process for forming a metal phosphate thin film on a substrate in a reaction chamber, wherein the metal phosphate comprises Ti, Al or Li, the process comprising a plurality of metal phosphate deposition cycles, each cycle comprising:
   providing a pulse of a first vapor phase metal reactant comprising Ti, Al or Li into the reaction chamber to form no more than about a single molecular layer of the reactant on the substrate;
   removing excess first reactant from the reaction chamber;
   providing a pulse of a second vapor phase phosphate reactant to the reaction chamber such that the second vapor phase reactant reacts with the first reactant on the substrate to form a metal phosphate thin film, wherein the second vapor phase phosphate reactant does not comprise a —OH group; and
   removing excess second reactant and reaction byproducts, if any, from the reaction chamber, and
   wherein the metal reactant and the phosphate reactant are the only reactants provided in each deposition cycle, and
   wherein each deposition cycle is free of plasma reactants.

2. The process of claim 1, wherein the first reactant comprises a titanium halide or titanium metalorganic compound.

3. The process of claim 2, wherein the first reactant is $TiCl_4$.

4. The process of claim 1, wherein the first reactant comprises an aluminum halide or an alkylaluminum compound.

5. The process of claim 4, wherein the first reactant is $AlCl_3$.

6. The process of claim 4, wherein the first reactant is dimethylaluminumchloride.

7. The process of claim 1, wherein the first metal reactant comprises a metalorganic lithium compound.

8. The process of claim 7, wherein the metalorganic lithium compound is a lithium alkoxide, lithium silyl amide or lithium betadiketonate.

9. The process of claim 7, wherein the metalorganic lithium compound is lithium hexamethyldisilazide (LiHMDS).

10. The process of claim 7, wherein the metalorganic lithium compound is selected from lithium tert-butoxide (Li-O$^t$Bu), Li(thd) and Li(hfac).

11. The process of claim 1, wherein the phosphate reactant has the formula O=P(OR)$_3$, wherein R can be any alkyl chain or ring, substituted or not.

12. The process of claim 11, wherein the phosphate reactant is trimethylphosphate (TMPD).

13. The process of claim 1, wherein a separate oxygen precursor is not used in the deposition process.

14. The process of claim 1, wherein the deposition cycle is carried out at a temperature of about 225° C. to about 350° C.

15. The process of claim 1, wherein the metal phosphate thin film forms part of a battery.

16. The process of claim 1, wherein the metal phosphate thin film comprises lithium and titanium, or lithium, titanium and aluminum.

17. An atomic layer deposition process comprising a plurality of lithium phosphate deposition cycles, each deposition cycle comprising alternately and sequentially contacting a substrate with a lithium reactant and trimethylphosphate (TMPO), wherein the lithium reactant is selected from bi(trimethylsilyl)amide (LiHMDS) and lithium tert-butoxide (LiO$^t$Bu), wherein the lithium reactant and the trimethylphosphate are the only reactants provided in each deposition cycle, and wherein each deposition cycle is free of plasma reactants.

18. The process of claim 16, wherein the metal phosphate thin film is $Li_xTi_y(PO_4)_z$ or $Li_xTi_yAl_z(PO_4)_a$.

* * * * *